United States Patent
You et al.

(10) Patent No.: US 12,176,813 B2
(45) Date of Patent: Dec. 24, 2024

(54) TRANS-INDUCTANCE MULTI-PHASE POWER CONVERTERS, MONITORING AND MANAGEMENT

(71) Applicant: Infineon Technologies Americas Corp., El Segundo, CA (US)

(72) Inventors: Zhiqing You, Torrance, CA (US); Tim Ng, Monterey Park, CA (US)

(73) Assignee: Infineon Technologies Austria AG, Villach (AT)

( * ) Notice: Subject to any disclaimer, the term of this patent is extended or adjusted under 35 U.S.C. 154(b) by 339 days.

(21) Appl. No.: 17/409,058

(22) Filed: Aug. 23, 2021

(65) Prior Publication Data

US 2023/0057705 A1 Feb. 23, 2023

(51) Int. Cl.
*H02M 3/158* (2006.01)
*G01R 31/40* (2020.01)
*H02M 1/00* (2006.01)

(52) U.S. Cl.
CPC .......... *H02M 3/1582* (2013.01); *G01R 31/40* (2013.01); *H02M 1/007* (2021.05)

(58) Field of Classification Search
CPC ............... H02M 3/1582; H02M 1/007; H02M 3/33571; G01R 31/40
See application file for complete search history.

(56) References Cited

U.S. PATENT DOCUMENTS

| 2012/0320641 A1* | 12/2012 | Chapman | H02M 7/48 363/37 |
| 2015/0349387 A1* | 12/2015 | Inaba | H01M 10/44 700/297 |
| 2020/0264239 A1 | 8/2020 | Jimichi et al. | |

OTHER PUBLICATIONS

Extended European Search Report, EP 22 19 1459, Feb. 2, 2023, pp. 1-9.
Wang Hanyu et al., "Switch Fault Diagnosis Method for Series-Parallel Forward DC-DC Converter System", IEEE Transactions on Industrial Electronics, IEEE Service Center, Piscataway, NJ, USA, vol. 66, No. 6, Jun. 1, 2019, pp. 4684-4695, XP011707477.

* cited by examiner

*Primary Examiner* — Jue Zhang
*Assistant Examiner* — Afework S Demisse
(74) *Attorney, Agent, or Firm* — Armis IP Law, LLC

(57) ABSTRACT

An apparatus such as a power supply includes management hardware. The management hardware monitors operation of multiple power converter phases coupled in parallel to produce an output voltage. Based on the monitored operation, the management hardware determines a status of a series circuit path connecting windings of the multiple power converter phases. The management hardware produces status information indicating the status of the series circuit path.

35 Claims, 13 Drawing Sheets

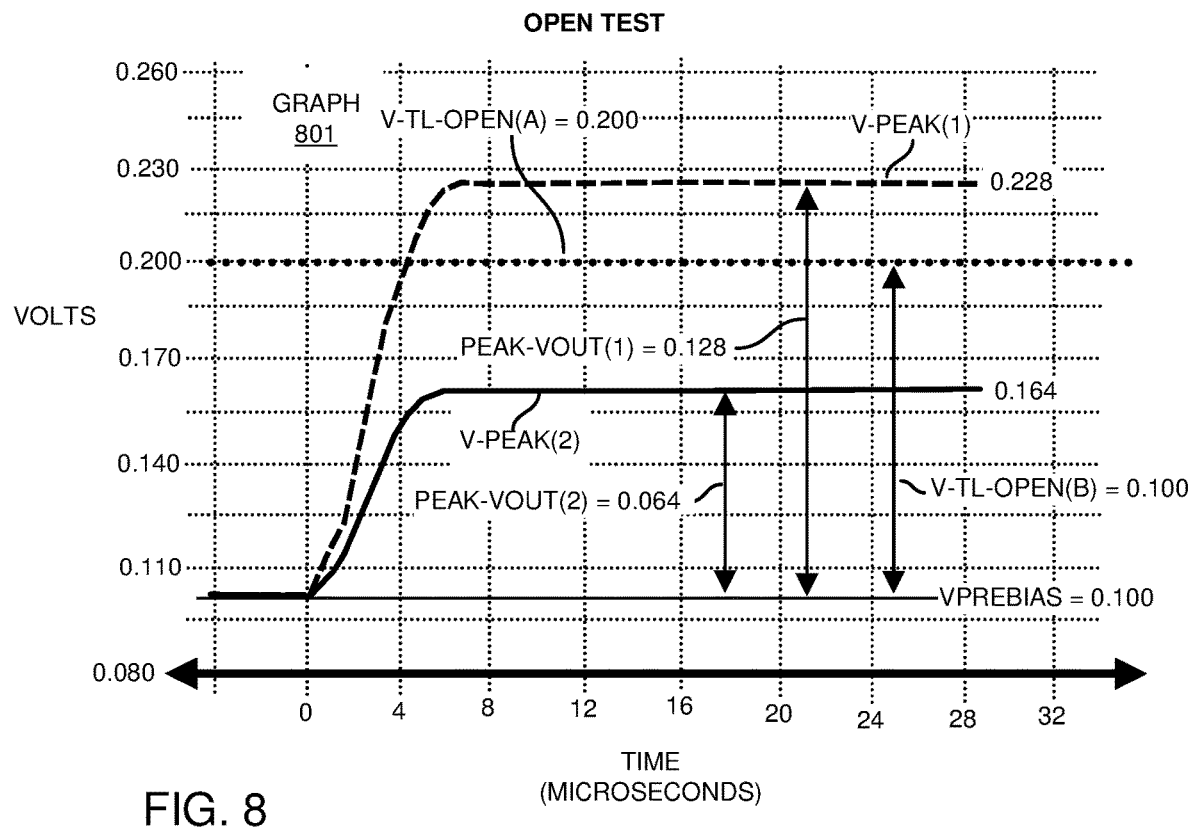
FIG. 8
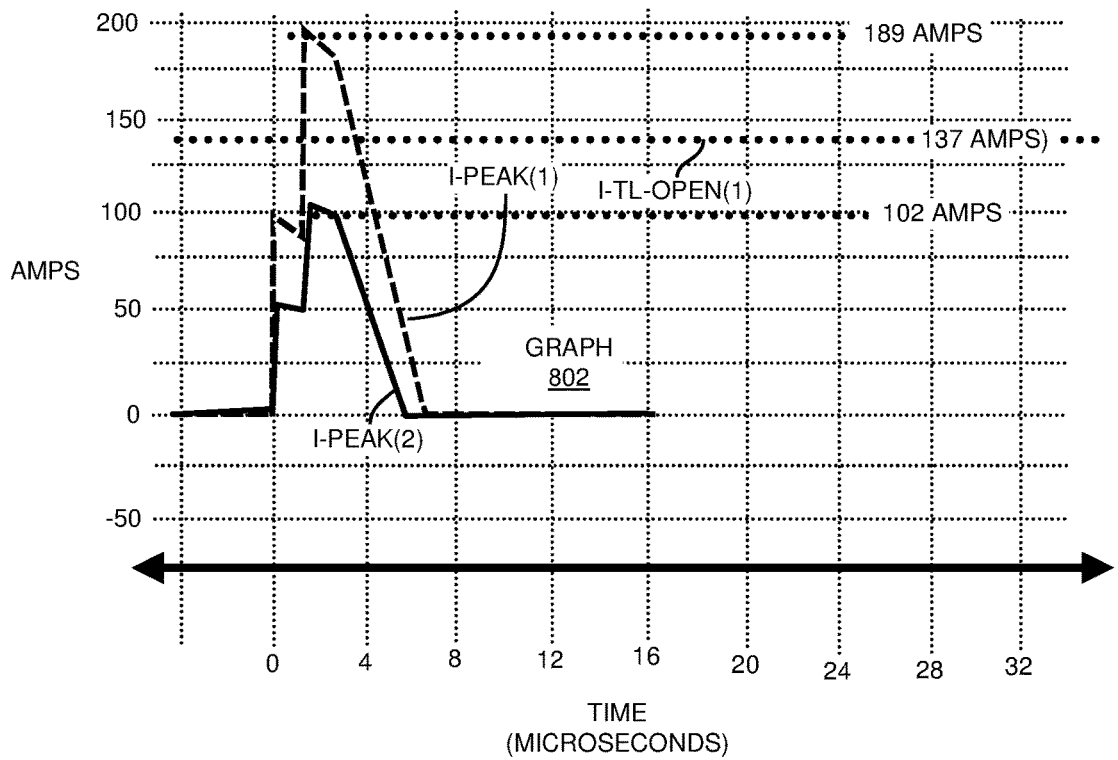

SHORT TEST
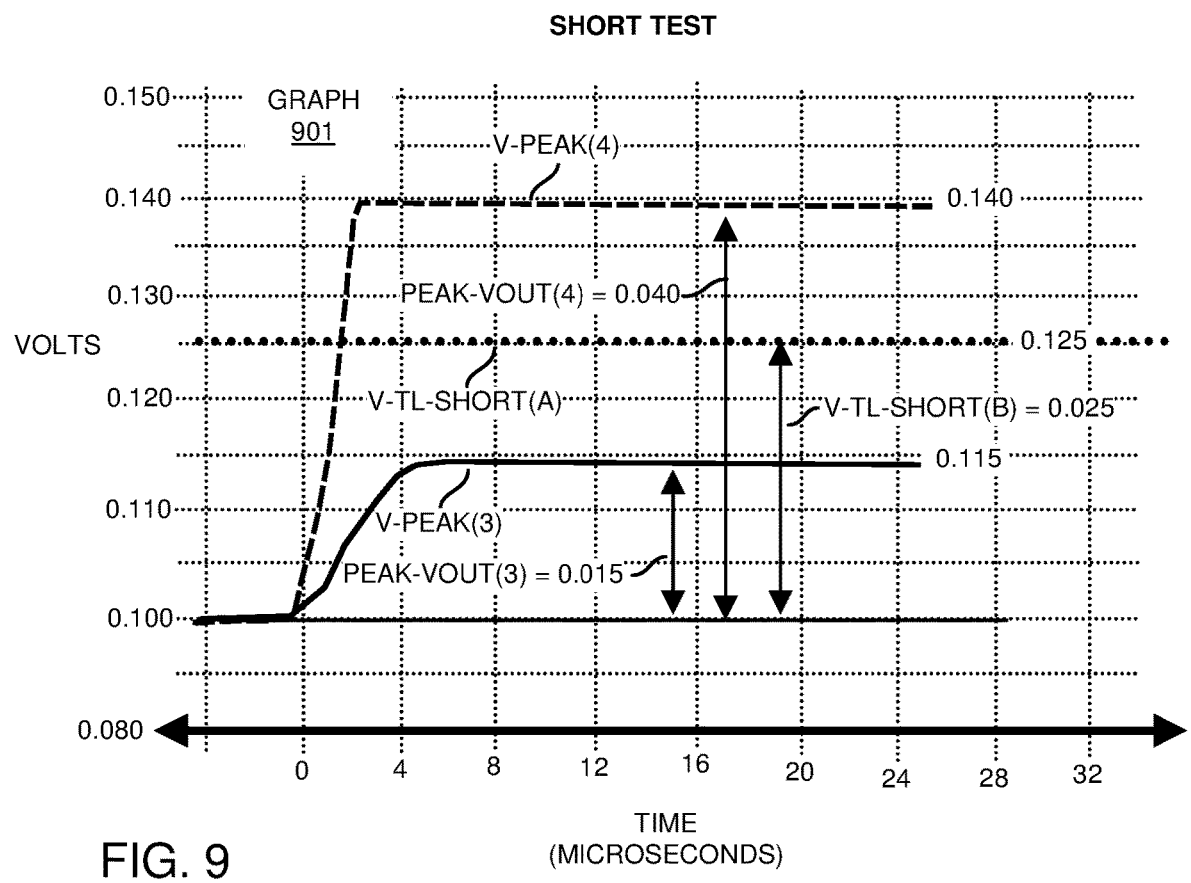
FIG. 9
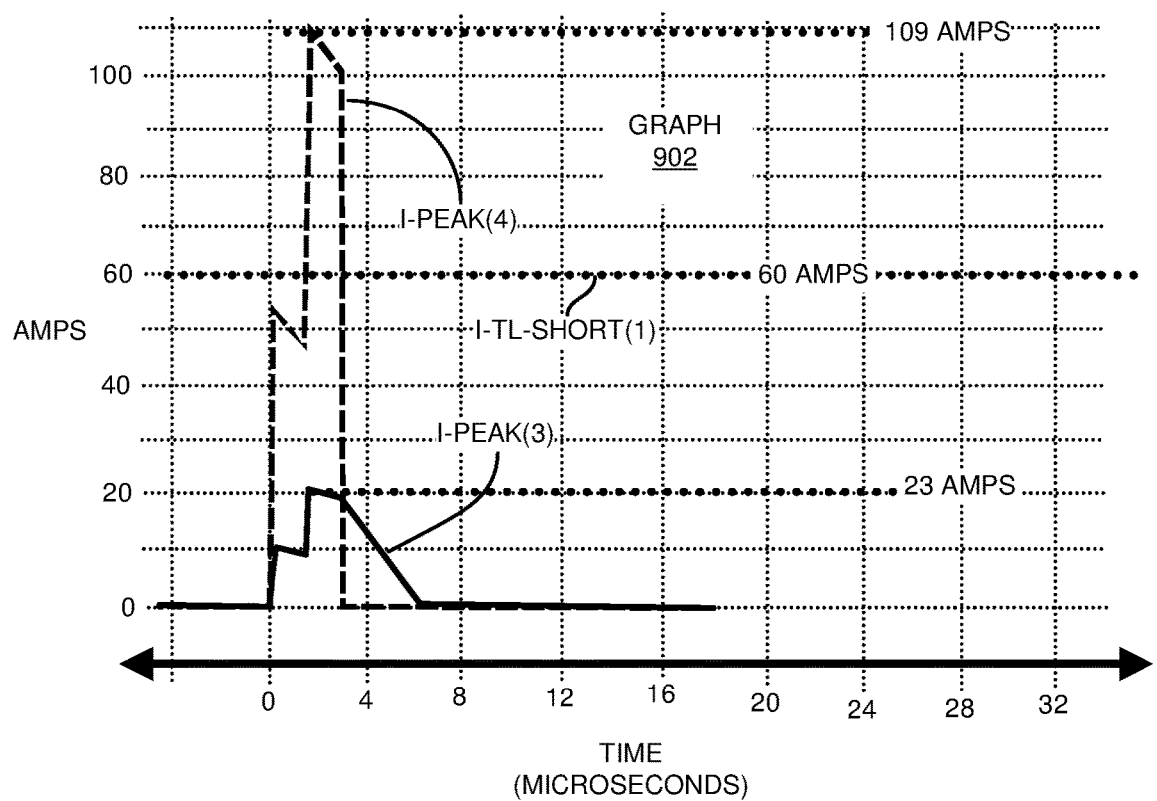

TRANS-INDUCTANCE MULTI-PHASE POWER CONVERTERS, MONITORING AND MANAGEMENT

BACKGROUND

There are multiple types of switching power converters. For example, one type of conventional switching power converter is a buck converter. In general, to maintain an output voltage within a desired range, a controller associated with the buck converter compares the magnitude of a generated output voltage to a setpoint reference voltage. Based on a respective error voltage, the controller modifies a respective switching frequency and/or pulse width modulation associated with activating high side switch circuitry or low side switch circuitry in the buck converter.

Another type of power converter is a so-called Trans-Inductor Voltage Regulator (TLVR). In general, a TLVR includes multiple power converter phases, each of which includes a multi-winding transformer. A first winding of each power converter phase (such as a buck converter configuration) is connected in series, providing coupling amongst the multiple phases. A second winding of each phase contributes to producing a respective output voltage which together helps power a load.

BRIEF DESCRIPTION

Implementation of clean energy (or green technology) is very important to reduce our impact as humans on the environment. In general, clean energy includes any evolving methods and materials to reduce an overall toxicity of energy consumption on the environment.

This disclosure includes the observation that raw energy, such as received from green energy sources or non-green energy sources, typically needs to be converted into an appropriate form (such as desired AC voltage, DC voltage, etc.) before it can be used to power end devices such as servers, computers, mobile communication devices, etc. Regardless of whether energy is received from green energy sources or non-green energy sources, it is desirable to make most efficient use of raw energy provided by such systems to reduce our impact on the environment. This disclosure contributes to reducing our carbon footprint (and green energy) via more efficient energy conversion.

Embodiments herein include novel ways of monitoring a status of a series circuit path connecting windings of multiple power converter phases.

More specifically, embodiments herein include management hardware. During a test mode, the management hardware (such as monitor hardware, controller, etc.) monitors operation of multiple power converter phases in a power converter. In one embodiment, the multiple power converter phases are coupled in parallel to produce an output voltage. Based on the monitored operation of the multiple power converter phases, the management hardware determines a status of a series circuit path including windings of the multiple power converter phases. The management hardware produces status information (such as notification information) indicating the status of the series circuit path.

Note that the status information can include any suitable information. For example, in one embodiment, the status information indicates an open circuit condition associated with the series circuit path. In another example embodiment, the status information indicates a short circuit condition associated with a winding in the series circuit path. Additionally, or alternatively, the status information includes an identity of the winding in the series circuit path experiencing the short circuit condition.

The management hardware can be configured to monitor any suitable one or more parameters to determine the status of the series circuit path. For example, in further example embodiments, the management hardware monitors a magnitude of the output voltage during application of test control signals to the multiple power converter phases to produce the output voltage. Additionally, the management hardware monitors a respective magnitude of output current supplied by each of the multiple power converter phases to produce the output voltage.

In further example embodiments, the management hardware receives an output current value. The output current value represents a summation of output current supplied by each of the power converter phases. The management hardware compares the output current value to an output current threshold value to determine the status of the series circuit path.

Still further embodiments herein include, via the management hardware, receiving an output voltage value. The output voltage value indicates a magnitude of the output voltage collectively produced by the power converter phases. The monitor hardware compares the output voltage value to an output voltage threshold value. In one embodiment, the management hardware also receives an output current value indicating a summation of output current supplied by each of the power converter phases. The management hardware compares the output current value to an output current threshold value. The management hardware compares the output voltage value to an output voltage threshold value. Based on results of comparing, the monitor hardware produces status information associated with the series circuit path.

In further example embodiments, in addition to determining that the series circuit path experiences a short circuit condition, the management hardware determines an identity of the series circuit path experiencing the short circuit condition. In one embodiment, in addition to noting the short circuit condition, the management hardware produces the status information to include an identity of a particular winding of the multiple windings in the series circuit path experiencing a short circuit condition.

In further example embodiments, each of the multiple power converters includes a respective transformer including a corresponding primary winding and a corresponding secondary. The series circuit path includes a series connectivity of the secondary windings of the multiple power converters. The status information indicates a status (such as shorted winding, open winding, open circuit path, etc.) associated with the series connectivity.

In still further example embodiments, the management hardware can be configured to implement one or more different tests to determine a respective status of the series circuit path. In one embodiment, the management hardware selects a test in which to control the operation of the multiple power converter phases. The management hardware applies control signals associated with the selected test to the multiple power converter phases to produce the output voltage and output current.

Embodiments herein are useful over conventional techniques. For example, embodiments herein include implementing unique monitoring of voltage and current parameters of a respective power supply to determine a status of a series circuit path including multiple windings.

These and other more specific embodiments are disclosed in more detail below.

Note that although embodiments as discussed herein are applicable to power converters, the concepts disclosed herein may be advantageously applied to any other suitable topologies as well as general power supply control applications.

Note that any of the resources as discussed herein can include one or more computerized devices, controller, mobile communication devices, servers, base stations, wireless communication equipment, communication management systems, workstations, user equipment, handheld or laptop computers, or the like to carry out and/or support any or all of the method operations disclosed herein. In other words, one or more computerized devices or processors can be programmed and/or configured to operate as explained herein to carry out the different embodiments as described herein.

Yet other embodiments herein include software programs to perform the steps and operations summarized above and disclosed in detail below. One such embodiment comprises a computer program product including a non-transitory computer-readable storage medium (i.e., any computer readable hardware storage medium) on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, embodiments herein are directed to methods, systems, computer program products, etc., that support operations as discussed herein.

One embodiment herein includes a computer readable storage medium and/or system having instructions stored thereon. The instructions, when executed by computer processor hardware, cause the computer processor hardware (such as one or more co-located or disparately located processor devices) to: monitor operation of multiple power converter phases in a power converter, the multiple power converter phases coupled in parallel to produce an output voltage; based on the monitored operation, determine a status of a series circuit path connecting windings of the multiple power converter phases; and produce status information indicating the status of the series circuit path.

The ordering of the steps above has been added for clarity sake. Note that any of the processing operations as discussed herein can be performed in any suitable order.

Other embodiments of the present disclosure include software programs and/or respective hardware to perform any of the method embodiment steps and operations summarized above and disclosed in detail below.

It is to be understood that the system, method, apparatus, instructions on computer readable storage media, etc., as discussed herein also can be embodied strictly as a software program, firmware, as a hybrid of software, hardware and/or firmware, or as hardware alone such as within a processor (hardware or software), or within an operating system or a within a software application.

As discussed herein, techniques herein are well suited for use in the field of implementing one or more inductor components to deliver current to a load. However, it should be noted that embodiments herein are not limited to use in such applications and that the techniques discussed herein are well suited for other applications as well.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of embodiments herein (BRIEF DESCRIPTION OF EMBODIMENTS) purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention (s), the reader is directed to the Detailed Description section (which is a summary of embodiments) and corresponding figures of the present disclosure as further discussed below.

BRIEF DESCRIPTION OF THE DRAWINGS

FIG. 8 is an example diagram illustrating graphs associated with monitoring a series circuit path for an open circuit condition according to embodiments herein.

FIG. 9 is an example diagram illustrating graphs associated with monitoring a series circuit path for a shorted winding according to embodiments herein.

Figure 1:
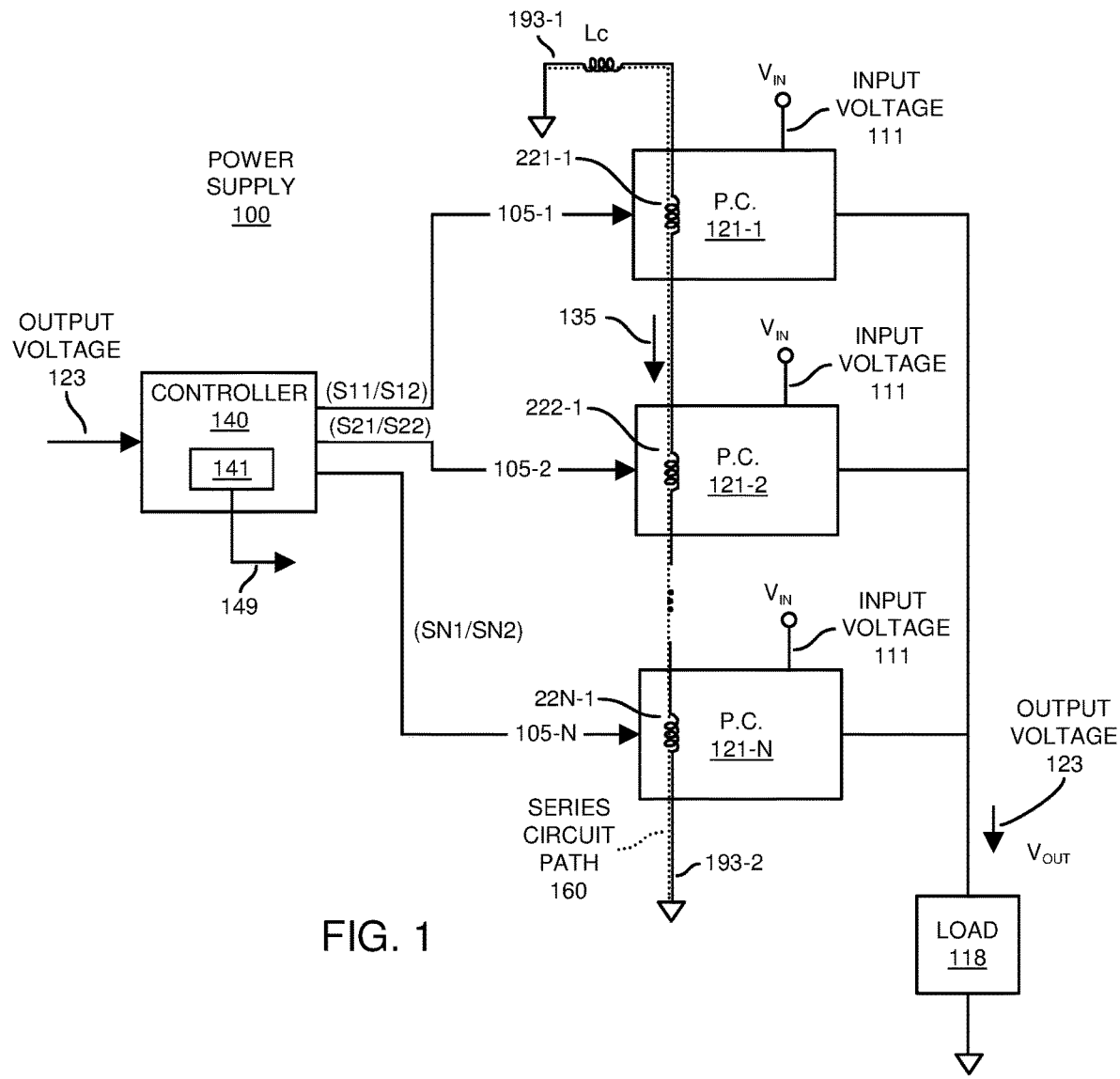
FIG. 1 is an example general diagram of a power system (power supply) including multiple inductive phases connected in series according to embodiments herein.

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

TLVR (trans-inductor voltage regulator) is generally a new topology that provides premium load transient response with less output capacitors compared to traditional multi-phase buck converter design. However, if any portion of the circuit on the secondary side of the TLVR circuit is open or shorted due to assembly issues (such as inductor not soldered down or solder bridge), any of the following conditions can occur:

- A conventional control system is not able to detect this issue because the impedance from the break point/short point to any point is 0, which is the same as a good unit.
- If secondary side winding is open, then voltage regulator will still power up using the inductor on the primary side which is back to traditional multiphase buck converter.
- If secondary side winding is shorted, then voltage regulator will shut down due to over current protection
- If the faulty power supply circuit is implemented in the field, with secondary side open assembly issue, the failed voltage regulator may cause a blue screen or system shutdown condition as a result of excessive undershoot when end customers start to overload CPU processors.

Embodiments herein detect TLVR secondary circuit open and short conditions, reducing occurrence of faulty systems being shipped to customers.

Now, more specifically, FIG. 1 is an example general diagram of a power system including a series circuit path of multiple inductively coupled windings according to embodiments herein.

In this example embodiment, the power system 100 includes a controller 140, management resource 141, multiple power converters 121 (such as power converter 121-1, power converter 121-2, ..., power converter 121-N), and dynamic load 118.

Each of the power converters (such as a respective power converter phase) can be configured to include one or more power converter phases to produce a respective output voltage 123 to power the dynamic load 118.

Note further that the management resource 141 can be included as part of the controller 140. Alternatively, the management resource 141 is disparately located with respect to the controller 140.

During test mode operation, the controller 140 monitors a magnitude of the output voltage 123 produced by the multiple power converters 121-1, 121-2, 121-3, etc. To maintain the magnitude of the output voltage 123 in a desired voltage range, the controller 140 produces control signals 105 (such as control signals 105-1, control signals 105-2, ..., control signals 105-N) applied to each of the power converter phases.

For example, as generally shown, control signals 105-1 (such as S11/S12) control operation of power converter 121-1; control signals 105-2 (such as S21/S22) control operation of power converter phase 121-2; ...; control signals 105-N (such as SN1/SN2) control operation of power converter phase 121-N.

Accordingly, embodiments herein include a controller 140 that controls operation of multiple power converters 121 in a power system 100. The multiple power converters 121 are coupled in parallel to convert an input voltage 111 (a.k.a., Vin or DC voltage) or multiple different input voltages into an output voltage 123 (such as a DC voltage) that powers the load 118. That is, each of the power converters (such as DC to DC converter) generates an output voltage 123 that is supplied to the load 118. Thus, the power converters 121 collectively produce the output voltage 123.

As further shown, each of the power converters 121 includes a respective transformer winding (such as secondary winding) to facilitate generation of the output voltage 123. For example, in this example embodiment, the power converter 121-1 includes winding 221-1; the power converter 121-2 includes winding 222-1; ..., the power converter 121-N includes winding 22N-1.

In further example embodiments, as shown, the series circuit path 160 includes a series connection of inductor Lc, winding 221-1, winding 222-1, ..., winding 22N-1. A first terminal end 193-1 of the series circuit path 160 is connected to ground; a second terminal end 193-2 of the series circuit path 160 is connected to ground as well. The series circuit path 160 supports conveyance of current 135.

As previously discussed, and as further discussed herein, the management resource 141 monitors a health status of the series circuit path 160. Based on the monitoring and detected one or more conditions, the management resource 141 produces status information 149 indicating any suitable information associated with the power supply 100. In one embodiment, the status information 149 (status information) indicates whether the series circuit path 160 experiences a failure such as open circuit condition, short circuit condition, etc.

Figure 2:
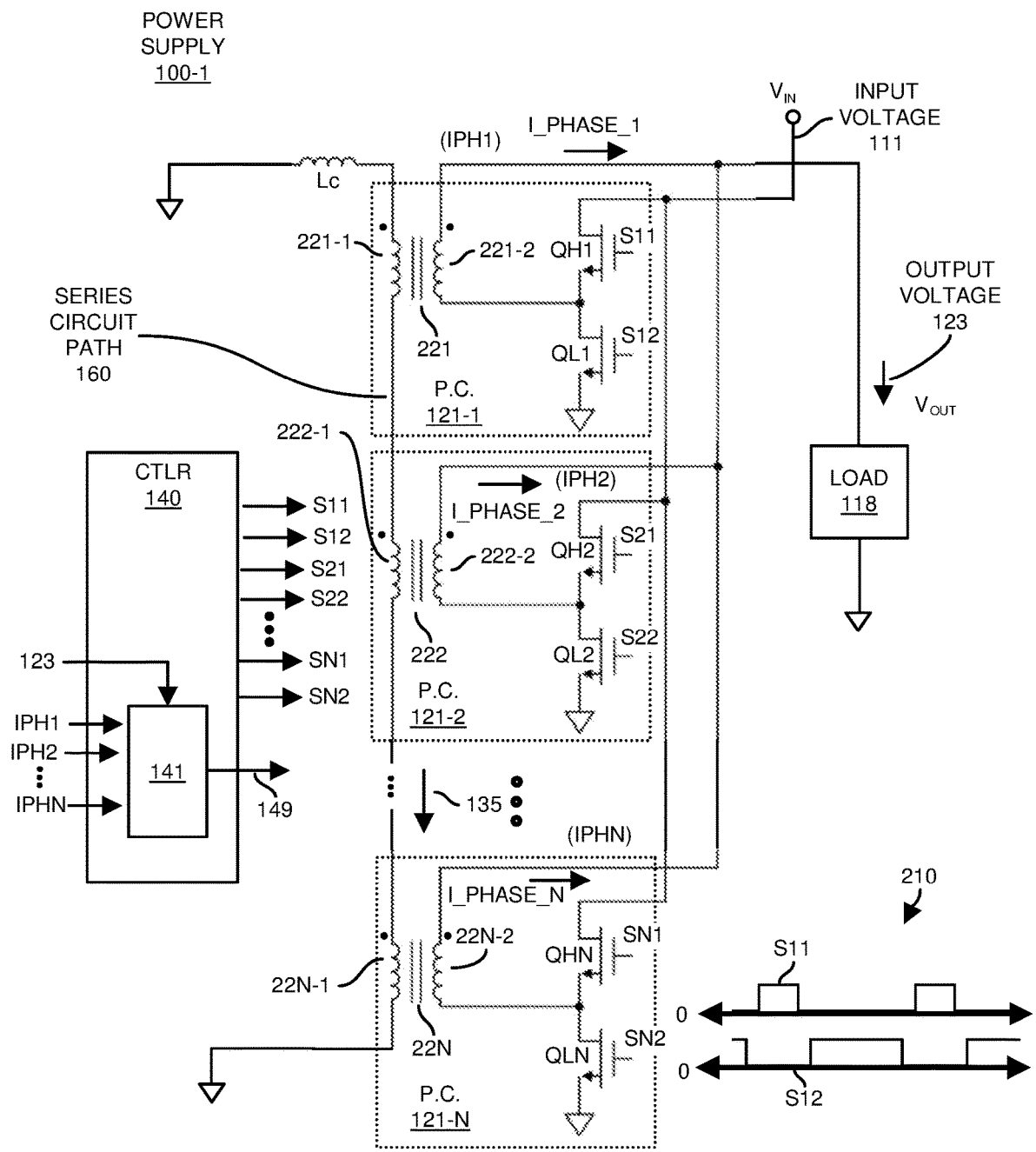
FIG. 2 is an example diagram illustrating a trans-inductance voltage regulator and corresponding controller/monitor according to embodiments herein.

FIG. 2 is a more detailed example diagram illustrating a trans-inductance voltage regulator and control of current through a series circuit path according to embodiments herein.

In this example embodiment, each of the power converters (such as a voltage regulator, power converter phase, etc.) includes a pair of switches (such as high side switch circuitry and low side switch circuitry) and one or more windings to contribute to generation of the output voltage 123.

Each power converter of the instance of power supply 100-1 can be implemented as a buck converter or other suitable power converter.

More specifically, in this example embodiment, the power converter 121-1 includes winding 221-1 (such as a secondary winding of transformer 221), winding 221-2 (such as primary winding of transformer 221), switch QH1 (such as high side switch circuitry including one or more field effect transistors or other suitable type of switches) controlled by signal S11 generated by the controller 140, and switch QL1 (such as low side switch circuitry including one or more field effect transistors or other suitable type of switches) controlled by signal S12 generated by controller 140. Switch QH1 of the power converter 121-1 is connected in series with switch QL1 between the input voltage 111 and a ground reference. The drain of switch QH1 receives the input voltage 111; the source of QH1 is connected to the drain of switch QL1 and contributes to producing the output voltage 123 via generated output current (I_PHASE1); the source of QL1 is connected to ground.

Further in this example embodiment, the power converter 121-2 includes winding 222-1 (such as a secondary winding of transformer 222), winding 222-2 (such as primary winding of transformer 222), switch QH2 (such as high side switch circuitry including one or more field effect transistors or other suitable type of switches) controlled by signal S21 generated by the controller 140, and switch QL2 (such as low side switch circuitry including one or more field effect transistors or other suitable type of switches) controlled by signal S22 generated by controller 140. Switch QH2 of the power converter 121-2 is connected in series with switch QL2 between the input voltage 111 and a ground reference. The drain of switch QH2 receives the input voltage 111; the source of QH2 is connected to the drain of switch QL2 and contributes to producing the output voltage 123 via generated output current (I_PHASE2); the source of QL2 is connected to ground.

Yet further in this example embodiment, the power converter 121-N includes winding 22N-1 (such as a secondary winding of transformer 22N), winding 22N-2 (such as primary winding of transformer 22N), switch QHN (such as high side switch circuitry including one or more field effect transistors or other suitable type of switches) controlled by signal S2N generated by the controller 140, and switch QLN (such as low side switch circuitry including one or more field effect transistors or other suitable type of switches) controlled by signal S2N generated by controller 140. Switch QHN of the power converter 12N-2 is connected in series with switch QLN between the input voltage 111 and a ground reference. The drain of switch QHN receives the input voltage 111; the source of QHN is connected to the drain of switch QLN and contributes to producing the output voltage 123 via generated output current (I_PHASEN); the source of QLN is connected to ground.

In one embodiment, the controller 140 generates the control signals depending on a magnitude of the output voltage 123 with respect to a desired setpoint voltage as in buck converter or other suitable technology. In general, as in a buck converter topology, activation of corresponding high side switch circuitry in a respective power converter phase increases a magnitude of the output voltage 123; activation of the low side switch circuitry results in decreased current to the load from the energy stored in the inductor/primary winding.

As previously discussed, in one embodiment, the secondary windings 221-1, 222-1 ... 22N-1, are first windings of the multiple power converters serially connected in the series circuit path 160. Each of the multiple power converter phases 121-1, 121-2, 121-N, includes a primary winding inductively coupled to a secondary winding. In such an embodiment, each of the primary windings 221-2, 222-2, ... , 22N-2, of the multiple power converters produces, based on control signals from the controller 140, respective phase output current (or voltage) contributing to generation of an output voltage 123 that powers a load 118.

For example, winding 221-2 produces/outputs current I_PHASE_1 (magnitude as indicated by value IPH1); winding 222-2 produces/outputs current I_PHASE_2 (magnitude as indicated by value IPH2); ... ; winding 22N-2 produces/outputs current I_PHASE_N (magnitude as indicated by value IPHN).

An example of control signals generated by the controller 140 over time is shown in timing diagram 210 of FIG. 2. For example, in one embodiment, the low side switch circuitry in a respective phase is activated when the corresponding high side switch circuitry is deactivated. The high side switch circuitry and low side switch circuitry are never activated at the same time. For example, there is a dead time between activating the high side switch circuitry and low side switch circuitry. The controller 140 controls each of the power converters in a similar manner.

Further in this example embodiment, power converter 121-1 represents phase_1 current supplied to load 118; power converter phase 121-2 represents phase_2 current supplied to load 118; ... ; power converter phase 12N represents phase_N current supplied to load 118.

As further shown, each of the power converters as described herein includes a respective transformer and pair of windings. For example, power converter phase 121-1 includes transformer 221 including winding 221-1 magnetically (inductively) coupled to the winding 221-2; power converter phase 121-2 includes transformer 222 including winding 222-1 magnetically (inductively) coupled to the winding 222-2; ... ; power converter phase 121-N includes transformer 22N including winding 22N-1 magnetically (inductively) coupled to the winding 22N-2.

In still further example embodiments, via the management resource 141, the controller 140 monitors a status of the series circuit path 160 operative to convey current 135 through the multiple windings 221-1, 222-1, ... , 22N-1.

Note that the management resource 141 can be instantiated in any suitable manner. For example, the management resource 141 can be implemented as monitor hardware, management software, or a combination of management hardware and management software.

In further example embodiments, the management resource 141 monitors a magnitude of the output current supplied by each of the power converters to the dynamic load 118. Current flow can be determined in any suitable manner. In one embodiment, each of the management resource 141 determines the magnitude of the current 135 based on a voltage across the Rds-ON resistance of a respective switch. Additionally, or alternatively, embodiments herein include implementing an Lc DCR current sensing, where a series RC network is placed across the inductor Lc to sense a magnitude of current.

Via monitoring of the output voltage 123 and a magnitude of the output currents I_PHASE_1, I_PHASE_2, ... , I_PHASE_N, the management resource 141 generates status information 149 indicating a health status of the series circuit path 160.

Figure 3:
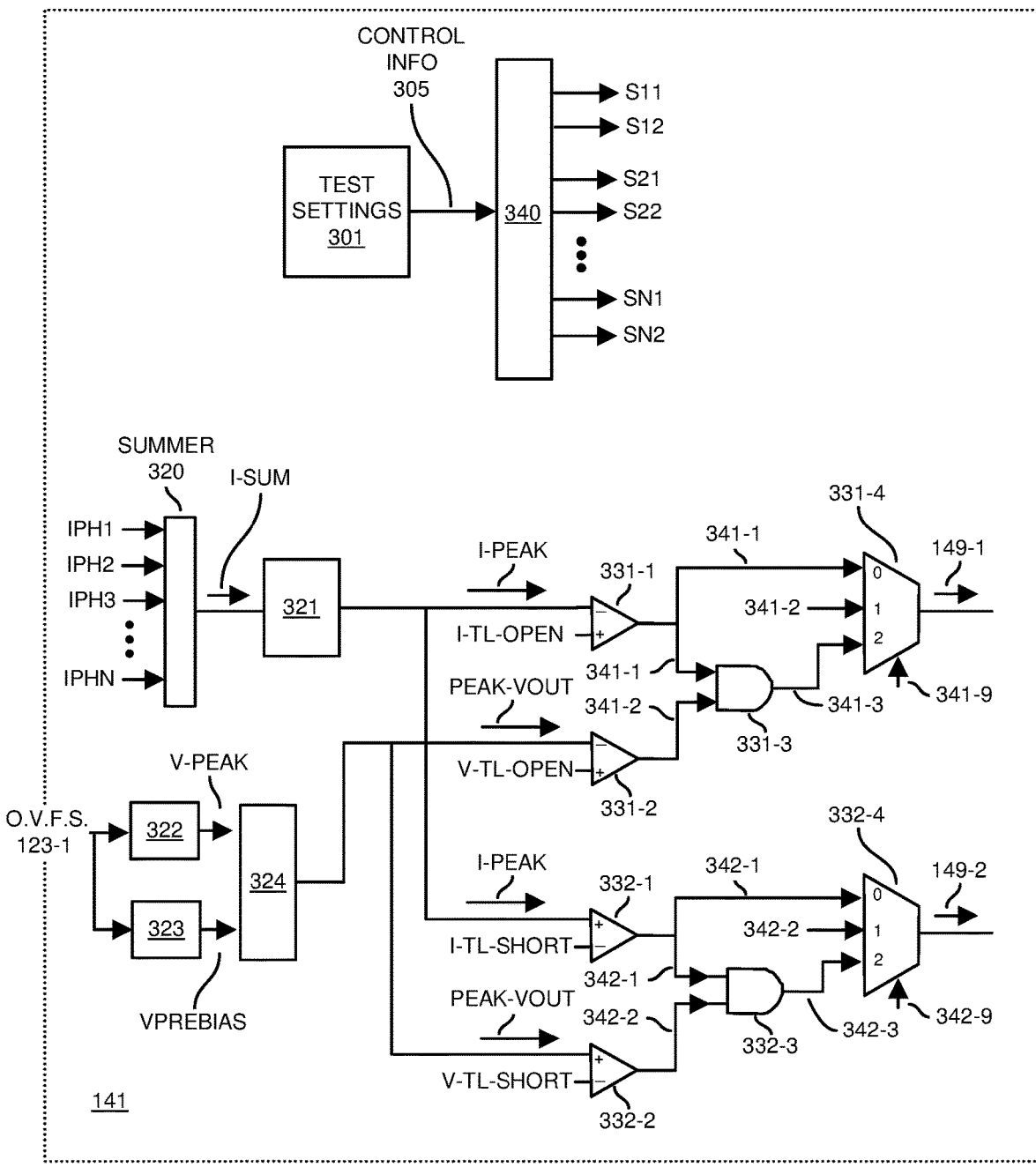
FIG. 3 is an example diagram illustrating a management resource operative to monitor a status of a series circuit path according to embodiments herein.

FIG. 3 is an example timing diagram illustrating a monitor resource operative to monitor a status of a series circuit path according to embodiments herein.

Note that the effective inductance of the inductors (221-2, 222-2, ... ) connected to the load 118 limits how fast current can increase or decrease in a given switching cycle. In a TLVR topology, as previously discussed (such as in FIG. 2), standard inductors are replaced by respective transformers (221, 222, etc.) having the primary side connecting the power stages to the load and the secondary side connected in a serial fashion into a current control inductor Lc. The primary windings (such as windings 221-2, 222-2, etc.) induce a voltage on the secondary side windings (such as windings 221-1, 222-1, etc.) which results in a change Lc voltage. Consequently, the current in the secondary side windings will increase or decrease governed by the voltage and rate of change in current relationship of Lc. Finally, this change in current in the secondary side induces a voltage on the primary side of all the connected phases. With the correct polarity connected in a TLVR topology, a PWM high on one phase will cause the change in current on the secondary side that would induce a positive voltage or equivalently higher current on the primary phases. This reduces the effective inductance on the primary coil. When multiple PWMs are high at the same time, the reduction in effective inductance is very large. This can result in much higher output current which also means high output voltage. However, if there is an open circuit in the serial connections to the secondary coils to Lc, the change in current on the secondary side will always be zero and the resultant output current amplitude and change in output voltage will not be different than standard topologies. If the secondary coil is shorted, the effective inductance on the primary side of the transformer is automatically reduced to the leakage inductance value which when PWM is driven high will result in a much high phase current than that without the short. Both open and short scenarios can be detected based on the measurements of the current or voltage.

In this example embodiment, the management resource 141 includes circuitry/logic such as summer 320, peak current detector 321, peak voltage detector 322, pre-bias voltage generator 323, differential voltage generator 324, comparator 331-1, comparator 331-2, comparator 332-1, comparator 332-2, logic 331-3, logic 332-3, multiplexer 331-4, and multiplexer 332-4.

As shown in FIG. 3, the summer 320 receives values indicative of the magnitude of the respective output currents generated by the power converters. For example, the summer 320 receives: i) value IPH1 (magnitude of the current I_PHASE_1) supplied by the power converter 121-1 to produce the output voltage 123, ii) value IPH2 (magnitude of the current I_PHASE_2) supplied by power converter 121-2 to produce the output voltage 123, ..., n) value IPHN (magnitude of the current I_PHASE_N) supplied by power converter 121-N to produce the output voltage 123. As its name suggests, the summer 320 produces I-SUM signal supplied to the peak current detector 321.

As further shown, the peak voltage detector 322 receives an output voltage value such as the output voltage feedback signal 123-1 (such as output voltage 123 itself of a ratio-metric voltage value proportionally tracking the output voltage 123). The peak voltage detector 322 produces V-PEAK signal, representing a peak voltage associated with the output voltage feedback signal 123-1 (such as output voltage 123) during the test mode.

Pre-bias voltage generator 323 also receives the output voltage feedback signal 123-1 as input and produces VPREBIAS signal (reference voltage value). As its name suggests, the VPREBIAS signal (such as starting reference signal) represents a magnitude of the output voltage feedback signal 123-1 just prior to implementation of a respective test mode as discussed herein. The starting magnitude of the output voltage 123 may be zero or some non-zero value at time 0.0.

Management resource 141 further includes the differential voltage generator 324. As its name suggests, the differential voltage generator 324 generates a PEAK-VOUT signal supplied to comparator 331-2 and comparator 332-2. In one embodiment, the PEAK-VOUT signal is equal to the detected peak voltage (such as magnitude of the V-PEAK signal) minus the VPREBIAS signal. Thus, in one embodiment, the PEAK-VOUT signal (such as magnitude of the difference between V-PEAK and VPREBIAS) is a relative value with respect to the reference VPREBIAS signal.

In further example embodiments, the controller 140 has access to test settings 301 in which to control operation of each of the power converters 121 during a test mode. For example, in one embodiment, for a given test, the controller 140 and corresponding pulse width modulation generator function 340 uses the control settings 301 to produce the different control signals S11/S12, S21/S22, ..., SN1/SN2.

Note that the test settings 301 can be configured to include any number of control parameter settings in which to test a status of the series circuit path 160. For example, in one embodiment, the test settings 301 indicate, for a given test, a number of pulse width modulation pulses to be applied to one or more power converters, pulse widths of activating high side switch circuitry and low side switch circuitry, a switching frequency of controlling the power converters, an order of controlling different pulses applied to the power converters, etc. In one embodiment, the management resource 141 determines control information 305 (test mode settings such as a number of pulse width modulation pulses to be applied to one or more power converters, pulse widths of activating high side switch circuitry and low side switch circuitry, a switching frequency of controlling the power converters, an order of controlling different pulses applied to the power converters, etc.) associated with the selected test and, in furtherance of executing the test mode, communicates the test mode settings associated with the selected test to the pulse width modulation generator function 340 (controller 140) that applies appropriate control signals to the multiple power converters in accordance with the selected test to produce the output voltage.

Figure 4:
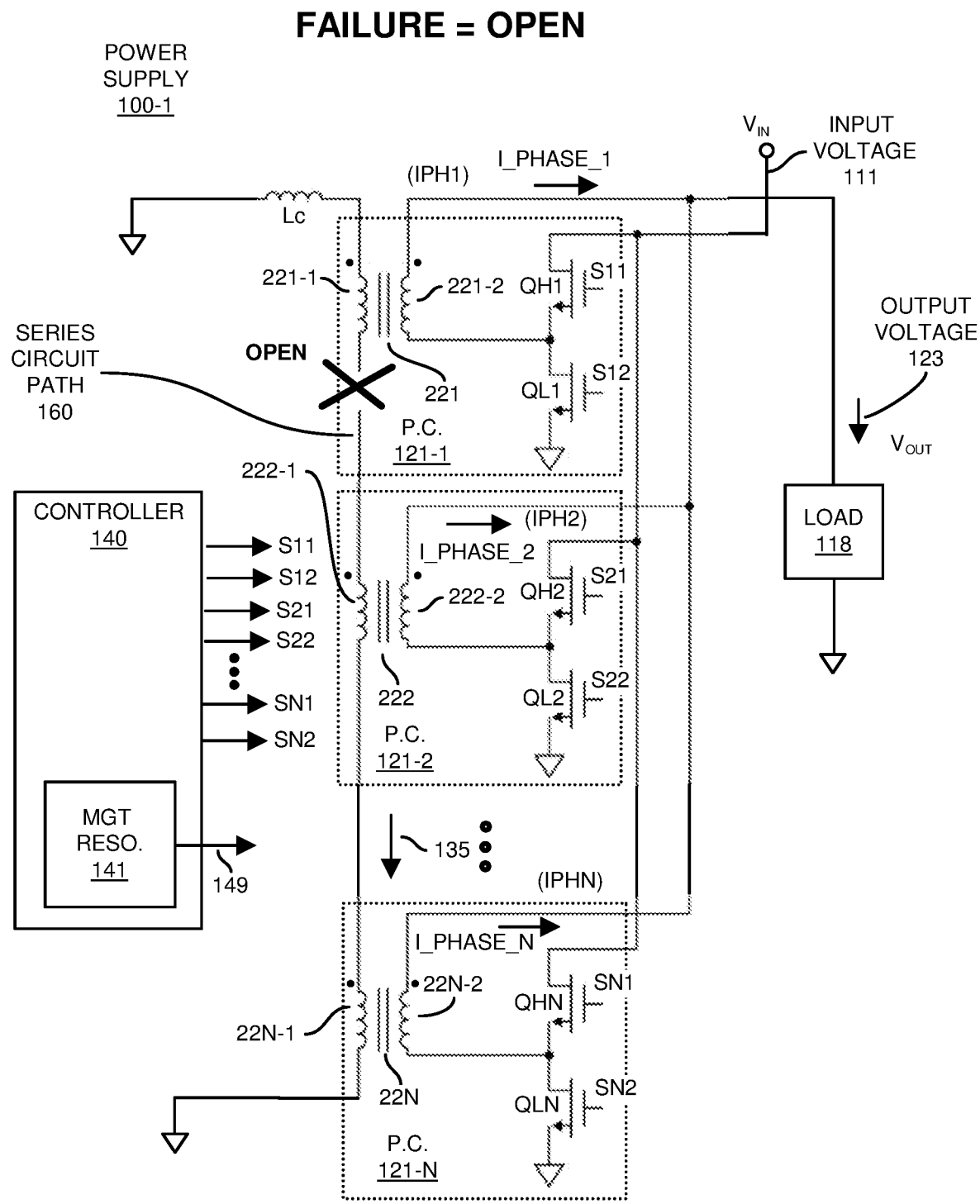
FIG. 4 is an example diagram illustrating an example open circuit condition in a series circuit path according to embodiments herein.

Further in this example embodiment, the management resource 141 determines a respective open condition associated with the series circuit path 160 as shown in FIG. 4. In one embodiment, the open circuit condition as illustrated in FIG. 4 prevents a flow of the current 135 through the series circuit path 160.

Referring again to FIG. 3, to determine a respective open circuit condition associated with the series circuit path 160, the management resource 141 uses both the peak total current (I-PEAK) as produced by the peak current detector 321 and the peak output voltage (PEAK-VOUT) as produced by the differential voltage generator 324.

More specifically, via comparator 331-1, the management resource 141 compares a magnitude of the I-PEAK signal to a threshold value I-TL-OPEN. Based on the comparison, the comparator 331-1 produces signal 341-1 supplied to the input channel 0 of the multiplexer 341-9 and input of logic 331-3 (such as an AND gate).

Via comparator 331-2, the management resource 141 compares a magnitude of the PEAK-VOUT signal produced by differential voltage generator 324 to a threshold value V-TL-OPEN. Based on the comparison, the comparator 331-2 produces signal 341-2 supplied to the input channel 1 of multiplexer 341-9 and input of logic 331-3 (such as an AND gate).

The logic 331-3 produces signal 341-3 (based on an AND of signal 341-1 and signal 341-2) and supplies it to the input channel 2 of multiplexer 341-9. As further shown, the logic 331-3 generates signal 341-3 based on the setting of the signal 341-1 and signal 341-2. If both signal 341-1 and signal 341-2 is a logic high, the logic 331-3 generates the signal 341-3 to be a logic high. In such an instance, when selector control signals 341-9 select channel 2, the multiplexer 331-4 generates the status information 149-1 to be a logic high (or other suitable status value) such as indicating that the series circuit path 160 experiences an open circuit condition. If neither of signal 341-1 nor 341-2 is a logic high, the logic 331-3 generates the signal 341-3 to be a logic low. In such an instance, when selector control signals 341-9 select channel 2, the multiplexer 331-4 generates the status information 149-1 to be a logic low (or other suitable status setting) such as indicating that the series circuit path 160 does not experience an open circuit condition.

Note further that, via selection of channel 0 input of the multiplexer 331-4, the selector control signals 341-9 can be set to convey signal 341-1 as an output to produce the status information 149-1. Via selection of channel 1 input of the multiplexer 331-4, the selector control signals 341-9 can be set to convey signal 341-2 as an output to produce the status information 149-1. Via selection of channel 2 input of the multiplexer 331-4, the selector control signals 341-9 can be set to convey signal 341-3 as an output to produce the status information 149-1.

Thus, the selector control signals 341-9 can be set to any suitable settings to produce the status information 341-9.

Figure 5:
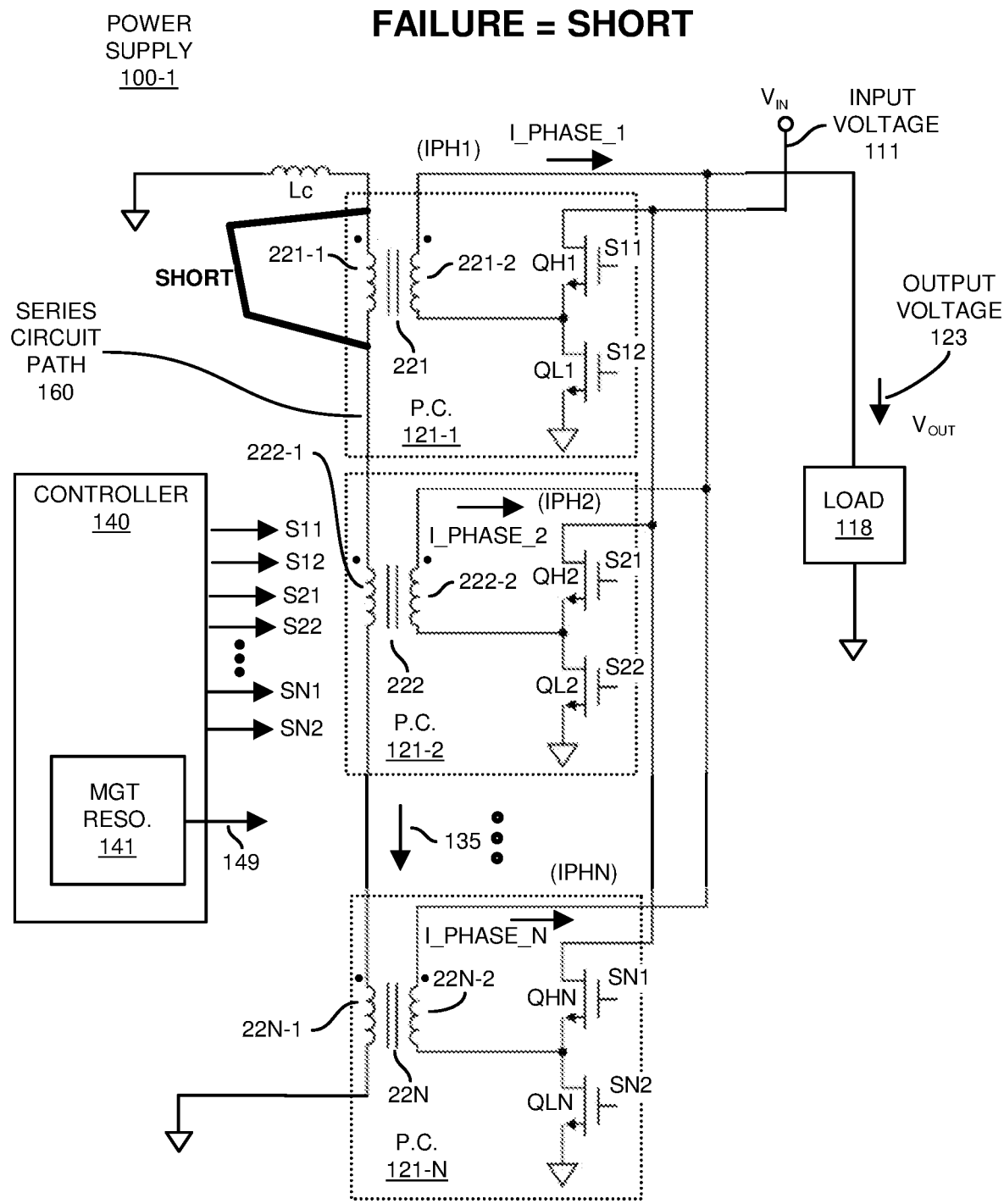
FIG. 5 is an example diagram illustrating an example short circuit of a winding in a series circuit path according to embodiments herein.

Further in this example embodiment, the management resource 141 determines a respective short circuit condition associated with each of the windings in the series circuit path 160 as shown in FIG. 5. In one embodiment, the short circuit condition prevents a respective power converter from operating properly. For example, in FIG. 5, the winding 221-1 of the power converter 121-1 is shorted, resulting in a failure associated with the power converter 121-1.

Referring again to FIG. 3, to determine a respective short circuit condition associated with the series circuit path 160, the management resource 141 uses both the peak total current (I-PEAK) as produced by the peak current detector 321 and the peak output voltage (PEAK-VOUT) as produced by the differential voltage generator 324.

More specifically, via comparator 332-1, the management resource 141 compares a magnitude of the I-PEAK signal produced by the peak current detector 321 to a threshold value I-TL-SHORT. Based on the comparison, the comparator 332-1 produces signal 342-1 supplied to the input of logic 332-3 (such as an AND gate) and channel 0 of the multiplexer 332-4.

Additionally, via comparator 332-2, the management resource 141 compares a magnitude of the PEAK-VOUT signal to a threshold value V-TL-SHORT. Based on the comparison, the comparator 332-2 produces signal 342-2 supplied to the input of logic 332-3 (such as an AND gate) and channel 1 input of the multiplexer 331-4.

The logic 332-3 generates signal 342-3 based on the setting of the signal 342-1 and signal 342-2. If either of signal 342-1 or 342-2 is a logic low, the logic 332-3 generates the signal 342-3 to be a logic low. In such an instance, when the channel selector settings 342-9 selects channel 2 of multiplexer 332-4, the multiplexer 332-4 generates the status information 149-2 to be a logic low (or other suitable message value) such as indicating that the series circuit path 160 does not experience a short circuit condition in a respective winding being tested during the test mode. If both signal 342-1 and signal 342-2 is a logic high, the logic 332-3 generates the signal 342-3 to be a logic high. In such an instance, when the channel selector settings 342-9 selects channel 2 of multiplexer 332-4, the multiplexer 332-4 generates the status information 149-2 to be a logic high such as indicating that a respective winding under test in the series circuit path 160 does experience a short circuit condition.

In one embodiment, if a short circuit condition is detected on a respective winding being tested, the management resource 141 generates the status information 149 to indicate a respective identity (such as winding 221-1 as in FIG. 4) of the winding that experiences the short circuit condition. When tested individually, in a manner as previously discussed, the management resource 141 determines when any respective winding of the secondary windings 221-1, 221-2, etc., experiences a respective short circuit failure.

Note further that, via selection of channel 0 input of the multiplexer 332-4, the selector control signals 342-9 can be set to convey signal 342-1 as an output of the multiplexer 332-4 to produce the status information 149-2. Via selection of channel 1 input of the multiplexer 332-4, the selector control signals 342-9 can be set to convey signal 342-2 as an output of the multiplexer 332-4 to produce the status information 149-2. Via selection of channel 2 input of the multiplexer 332-4, the selector control signals 342-9 can be set to convey signal 342-3 as an output to produce the status information 149-2.

Thus, the selector control signals 342-9 can be set to any suitable settings to produce the status information 342-9.

Figure 6:
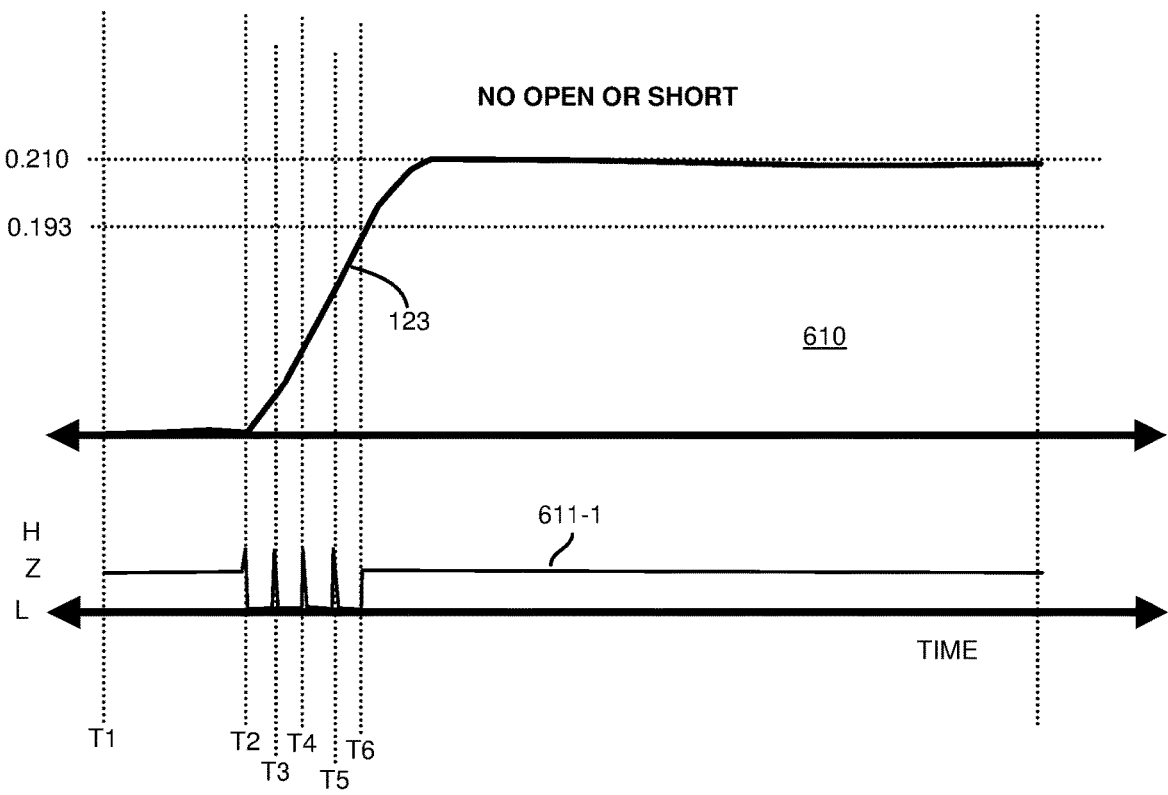
FIG. 6 is an example diagram illustrating graphs of different instances of monitoring an output voltage to determine a status of a series circuit path of multiple windings according to embodiments herein.
Figure 6:
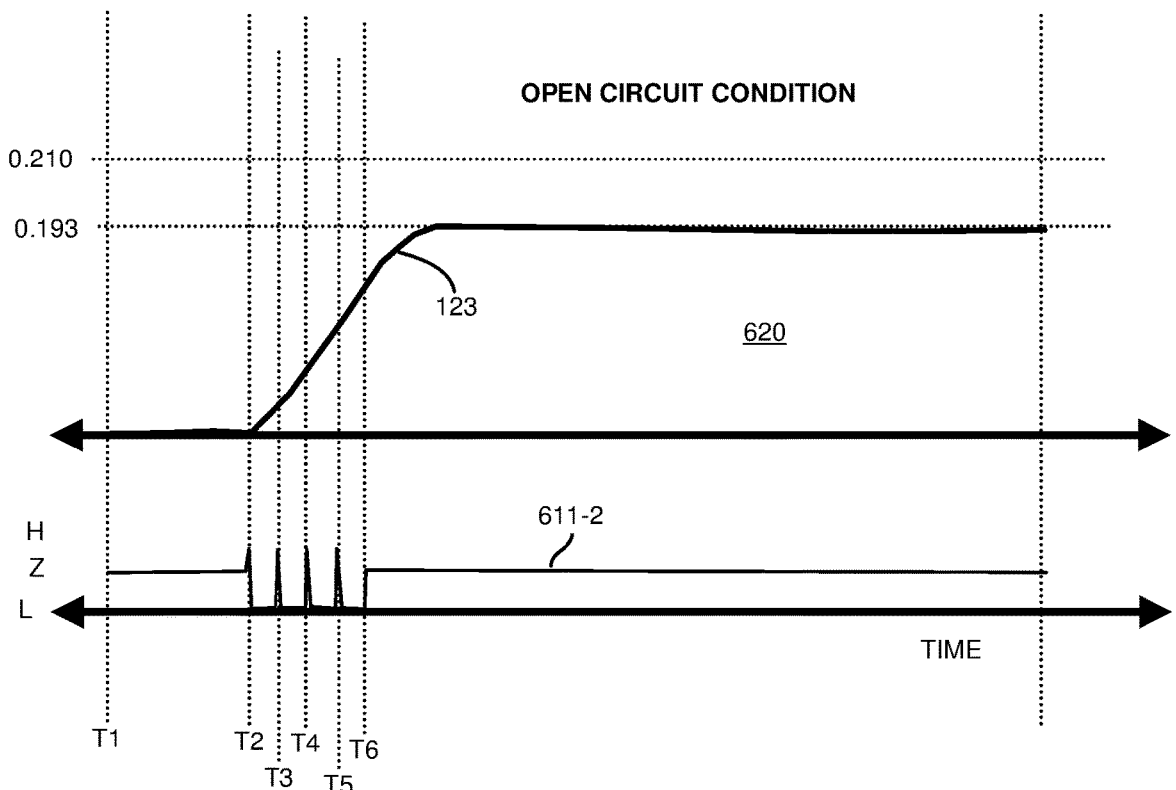

FIG. 6 is an example diagram illustrating graphs of monitoring an output voltage to determine a status of a series circuit path of multiple windings according to embodiments herein.

In this example embodiment, the test conditions are as follows:
TLVR inductance=105 nH
Lc=100 nH
Output capacitance=4981 uF
Power converter phase count=8
PWM control settings:
  PWM pulse count=4
  Hi side ON PWM (denoted as H) pulse width=100 ns
  Switching frequency=800 kHz
  PWM firing phase position=phase1 and phase2

As shown in FIG. 6, graph 610 indicates a result of the output voltage 123 during a condition in which there are no open or short failure conditions associated with the series circuit path 160. Based on test settings 301, the controller 140 controls the switches of a respective power converter via switching between Z state (such as when both high side switch circuitry and low-side switch circuitry in the power converter are deactivated), H state (such as when high side switch circuitry is activated to ON state and low-side switch circuitry in the power converter is deactivated to an OFF state), and L state (such as when high side switch circuitry is deactivated to OFF state and low-side switch circuitry in the power converter is activated to an ON state).

Via control signals 611-1, the controller 140 pulses the high side switch circuitry of a respective power converter to an ON-state at or around times T2, T3, T4, and T5. In one embodiment, the on time duration is 100 nanoseconds or other suitable value. This causes a magnitude of the over-voltage 123 to increase as shown in graph 610 to around 0.210 volts DC. As further discussed herein in FIGS. 8 and 9, the magnitude of the output voltage 123 in graph 610 indicates that this is a non-failure condition.

Referring again to FIG. 6, during an open circuit condition, via control signals 611-2, the controller 140 pulses the high side switch circuitry of a respective power converter to an ON-state at or around times T2, T3, T4, and T5. This causes a magnitude of the over-voltage 123 to increase as shown in graph 620 to around 0.193 volts DC. The magnitude of the output voltage 123 in graph 620 indicates that this is a failure condition (open circuit).

Figure 7:
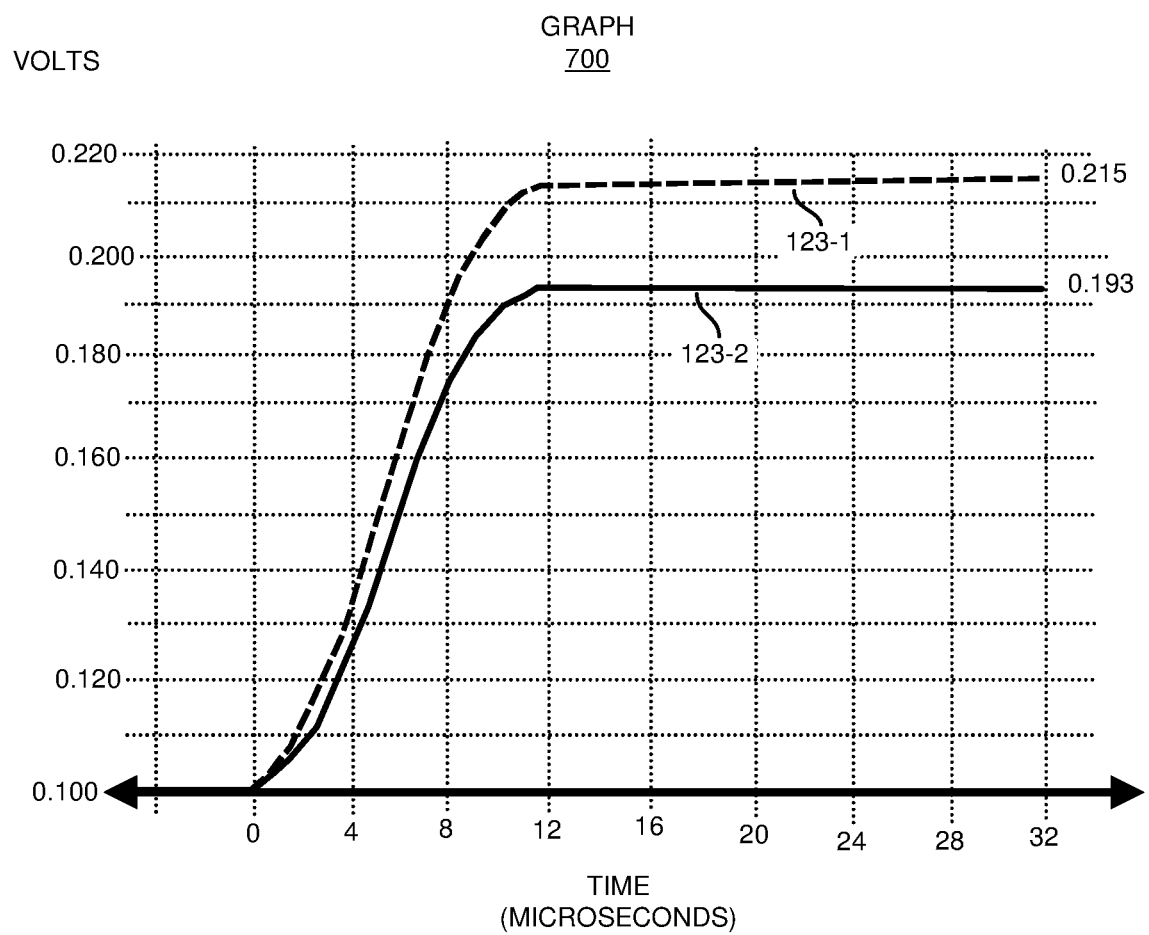
FIG. 7 is an example diagram illustrating a graph of an output voltage during a simulation of a normal winding condition versus an open winding condition in a series circuit path according to embodiments herein.

FIG. 7 is an example diagram illustrating a graph of an output voltage during a simulation of a normal winding condition versus an open winding condition in a series circuit path according to embodiments herein.

Graph 700 represents a simulation of the peak output voltage (signal 123-1) during a normal (non-failure condition). In such an instance, the magnitude of the output voltage signal 123-1 (output voltage for the first test of no open or short condition) increases to a value of 0.215 volts DC during the implementation of the test mode starting at time 0.

Graph 700 also represents a simulation of the peak output voltage 123 during an open circuit condition associated with the series circuit path 160 (failure condition). In such an instance, the magnitude of the output voltage 123-2 (output voltage for the second test of an open circuit condition) only increases to a value of 0.193 volts DC. The failure to reach a magnitude of around 0.210 DC in this second test indicates that the series circuit path 160 experiences as a respective failure.

FIG. 8 is an example diagram illustrating graphs associated with monitoring a series circuit path according to embodiments herein.

In further example embodiments, the magnitudes of the peak output voltage (such as PEAK-VOUT signal. VPEAK, etc.), and peak current (such as I-PEAK) provides a strong indication whether the series circuit path 160 experiences an open circuit condition or not.

The graph 801 and graph 802 are based on the following test mode setup:

Test2: Secondary Open Circuit Test:
   Secondary winding inductance=105 nH
   Lc=100 nH
   Output capacitance=4981 uF
   Power converter count=8
   PWM control settings:
      high side switch circuitry PWM pulse count=2
      PWM pulse width=100 ns
      Switching frequency=800 kHz
      PWM firing phase position=phase1~5

With reference to both FIGS. 3 and 8, for case #1 (such as when there is no open condition in the series circuit path 160), the controller 140 applies a sequence of controlling high side switch circuitry and low side switch circuitry of the respective power converters 121 in accordance with respective test settings 301 to determine whether the series circuit path 160 experiences an OPEN circuit condition. An example of the test control signals (such as one or more pulses) applied to control high side switch circuitry and low side switch circuitry are shown in FIG. 6 between time T2 and time T6. In this example embodiment, application of the control signals (such as similar to FIG. 6 between time T2 and time T6) results in an increase in the magnitude of the output voltage 123 and corresponding output current as shown in graphs 801 and 802. In one embodiment, the pulses are applied starting at time 0.0 micro-seconds and end prior to 4.0 microseconds.

Assume that the dynamic load 118 is not connected to the power supply 100 during this test of whether the series circuit path 160 experiences an open circuit condition. Assume further that the first case (1) represents a non-open circuit condition associated with the series circuit path 160. In this example embodiment, application of the control sequence (see FIG. 6) at or around time 0.0 results in an increase in the output voltage 123. As previously discussed, the peak voltage detector 322 monitors the magnitude of the output voltage 123 and produces the V-PEAK (1) signal of graph 801 inputted to the comparator 331-2. The comparator 331-2 compares the corresponding PEAK-VOUT (1) signal to the threshold level V-TL-OPEN (B) (such as 0.100 VDC) as specified by the test settings 301. The comparator 331-2 produces the signal 341-2 to be a logic low because the signal PEAK-VOUT (1) of graph 801 is greater than the threshold level V-TL-OPEN (B) (0.100 VDC).

Additionally, for the first case (1), application of the control sequence at time 0.0 results in an increase in the peak detected output current. For example, the peak current detector 321 produces the I_PEAK (1) signal of graph 802 inputted to the comparator 331-1. The comparator 331-1 compares the I-PEAK (1) signal (189 Amps) to the threshold level I-TL-OPEN (such as 137 AMPS). The comparator 331-2 produces the signal 341-1 to be a logic low because the I-PEAK (1) signal is greater than the I-TL-OPEN threshold level.

In this first case, because both the signal 341-1 and signal 341-2 are greater than the respective threshold levels, the logic 331-3 produces signal 341-3 to be a logic low as well. In such an instance, as previously discussed, the management resource 141 produces the status information 149-1 to indicate the non-failure condition (series circuit path 160 not experiencing an open circuit) for case #1 (1). As previously discussed, either of the signal 341-1 or signal 341-2 may be a logic high or logic low and is selectable for outputting region of material the multiplexer 331-4 via the selector control signals 341-9.

For case #2 (open failure condition on the series circuit path 160), the controller 140 applies a sequence of controlling high side switch circuitry and low side switch circuitry of the respective power converters 121 in accordance with respective test settings 301 (such as in FIG. 6) to determine whether the series circuit path 160 experiences an OPEN circuit condition.

Assume that the dynamic load 118 is not connected to the power supply 100 during this test in which the series circuit path 160 experiences an OPEN condition. Thus, the second case (2) represents an open circuit condition associated with the series circuit path 160. In this example embodiment, application of the control sequence at time 0.0 results in an increase in the output voltage 123. Based on monitoring the output voltage 123 for the open circuit series circuit path 160, the differential voltage generator 324 produces the PEAK-VOUT (2) signal inputted to the comparator 331-2 based on monitoring of the output voltage 123 during the test mode. The comparator 331-2 compares the PEAK-VOUT (2) signal (peak output voltage) in graph 801 to the threshold level V-TL-OPEN (B) (such as 0.100 VDC). The comparator 331-2 produces the signal 341-2 to be a logic high because the signal V-PEAK (2) (0.064 VDC) is less than the threshold level V-TL-OPEN (B) (0.100 VDC).

Additionally, for the second case (2), application of the control sequence at time 0.0 results in an increase in the peak detected output current. For example, the peak current detector 321 produces the I-PEAK (2) signal (102 AMPS) inputted to the comparator 331-1. The comparator 331-1 compares the I-PEAK (2) signal to the threshold level I-TL-OPEN (such as 137 AMPS). The comparator 331-2 produces the signal 341-1 to be a logic high because the signal I-PEAK (2) is less than the threshold level I-TL-OPEN (137 AMPS).

In this second case, because both the signal 341-1 and signal 341-2 are logic high, the logic 331-3 produces 341-3 to be a logic high as well. In such an instance, as previously discussed, the management resource 141 produces the status information 149-1 to indicate the failure condition (series circuit path 160 experiencing an open circuit). As previously discussed, either of the signal 341-1 or signal 341-2 may be a logic high or logic low and is selectable for outputting region of material the multiplexer 331-4 via the selector control signals 341-9.

FIG. 9 is an example diagram illustrating graphs associated with monitoring a series circuit path according to embodiments herein.

Test3: Secondary Winding Short Circuit Condition Simulation and Test:
   TLVR inductance=105 nH
   Lc=100 nH
   Output capacitance=4981 uF
   Phase count=8
   PWM short on phase1
   PWM control settings:
      high side switch circuitry PWM pulse count=2
      PWM pulse width=100 ns
      Switching frequency=800 kHz
      PWM firing phase position=phase1

With reference to both FIGS. 3 and 9, for case #3 (an example case in which there is no short of any winding in the series circuit path 160), the controller 140 applies a sequence of controlling high side switch circuitry and low side switch circuitry to one or more of the respective power converters 121 in accordance with respective test settings 301 to determine whether the series circuit path 160 experiences an SHORT circuit condition.

In one embodiment, test settings (301) are used to determine respective threshold levels I-TL-SHORT and V-TL-SHORT pertinent to the short circuit test. An example of the test control signals (such as one or more pulses) applied to control high side switch circuitry and low side switch circuitry are shown in FIG. 6 between time T2 and time T6, resulting in an increase in the magnitude of the output voltage 123 and total output current as shown in graphs 901 and 902. In one embodiment, the pulses are applied starting at or around time 0.0 micro-seconds and end prior to 4.0 microseconds.

Assume that the dynamic load 118 is not connected to the power supply 100 during this test mode of whether the series circuit path 160 experiences a shorted secondary winding condition. Assume further that the third case (3) as mentioned represents a non-short circuit condition associated with the winding 221-1 in the series circuit path 160.

In this example embodiment, application of the control sequence to power converter 121-1 (see FIG. 6) at time 0.0 results in an increase in the output voltage 123. In a manner as previously discussed, the peak voltage detector 322 monitors the magnitude of the output voltage 123 and the differential voltage generator 324 produces the PEAK-VOUT (3) signal (as shown in graph 901 just after time=4 microseconds) as inputted to the comparator 332-2. The comparator 332-2 compares the received PEAK-VOUT (3) signal to the threshold level V-TL-SHORT (B) (such as 0.025 VDC). The comparator 332-2 produces the signal 342-2 to be a logic low because the signal PEAK-VOUT (3) (0.015 VDC) of graph 901 is less than the threshold level V-TL-SHORT (B) (0.025 VDC).

Additionally, for the third case (3), application of the control sequence at time 0.0 results in an increase in the peak detected output current. For example, the peak current detector 321 produces the I-PEAK (3) signal inputted to the comparator 332-1. The comparator 332-1 compares the I-PEAK (3) signal (23 Amps) to the threshold level I-TL-SHORT (such as 60 AMPS). The comparator 332-1 produces the signal 342-1 to be a logic low because the I-PEAK (3) signal is less than the I-TL-SHORT threshold level.

In this third case, because both the signal 342-1 and signal 342-2 are less than the respective threshold levels, the logic 332-3 produces signal 342-3 to be a logic low as well. In such an instance, as previously discussed, the management resource 141 produces the status information 149-2 to indicate the non-failure or no short condition (associated with winding 221-1 in series circuit path 160 not experiencing an open circuit).

With reference to both FIGS. 3 and 9, for case #4 (when there is a short of winding 221-1 in the series circuit path 160 as in FIG. 5, where current bypasses the winding 221-1 due to the short), the controller 140 applies a sequence of controlling high side switch circuitry and low side switch circuitry to the respective power converters 121 in accordance with respective test settings 301 to determine whether the series circuit path 160 experiences an SHORT circuit condition. In one embodiment, test settings 301 are used to determine respective threshold levels I-TL-SHORT and V-TL-SHORT pertinent to the short circuit test. An example of the test control signals applied to control high side switch circuitry and low side switch circuitry are shown in FIG. 6, resulting in an increase in the magnitude of the output voltage 123 and total output current.

Assume that the dynamic load 118 is not connected to the power supply 100 during this test in FIG. 9 of whether the series circuit path 160 experiences an open circuit condition. Assume further that the fourth case (4) as mentioned represents a short circuit condition associated with the winding 221-1 in the series circuit path 160. In this example embodiment, application of the control sequence (see FIG. 6) at time 0.0 results in an increase in the output voltage 123. In a manner as previously discussed, the peak voltage detector 322 monitors the magnitude of the output voltage 123 and differential voltage generator 324 produces the PEAK-VOUT (4) signal inputted to the comparator 332-2. The comparator 332-2 compares the PEAK-VOUT (4) signal to the threshold level V-TL-SHORT (B) (such as 0.025 VDC). The comparator 332-2 produces the signal 342-2 to be a logic high because the signal V-PEAK (4) (0.040 VDC) of graph 901 is greater than the threshold level V-TL-OPEN (0.025 VDC).

Additionally, for the fourth case (4), application of the control sequence at time 0.0 results in an increase in the peak detected output current. For example, the peak current detector 321 produces the I_PEAK (4) signal inputted to the comparator 332-1. The comparator 332-1 compares the I-PEAK (4) signal (109 Amps) to the threshold level I-TL-SHORT (such as 60 AMPS). The comparator 332-1 produces the signal 342-1 to be a logic high because the I-PEAK (4) signal is greater than the I-TL-SHORT threshold level.

In this fourth case (4), because both the signal 342-1 and signal 342-2 are greater than the respective threshold levels, the logic 332-3 produces signal 342-3 to be a logic high as well. In such an instance, as previously discussed, the management resource 141 produces the status information 149-2 to indicate the failure condition (winding 221-1 in series circuit path 160 experiencing a short circuit). As previously discussed, the management resource 141 can be configured to generate a notification of an identity of a specific winding experiencing a respective failure. The management resource 141 repeats the test for each power converter and corresponding phase to determine which, if any, of the secondary windings in the series circuit path 160 are shorted.

Figure 10:
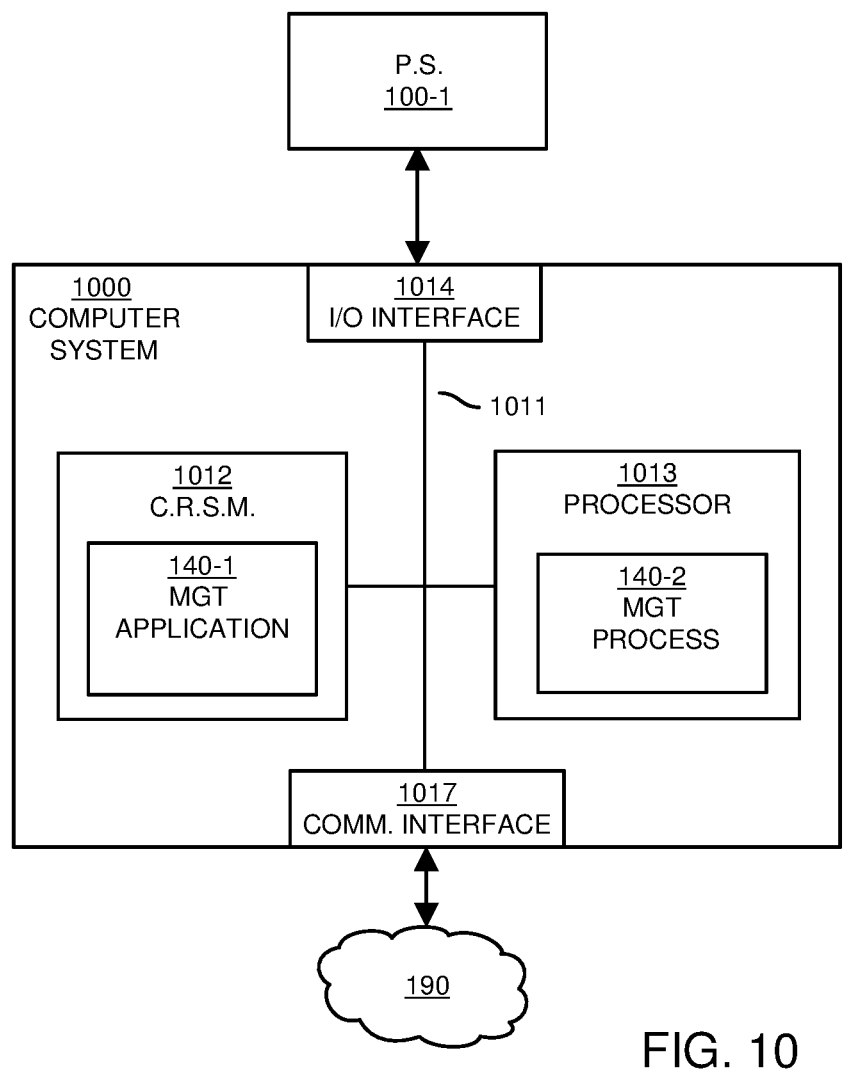
FIG. 10 is an example diagram illustrating computer processor hardware and related software instructions that execute methods according to embodiments herein.

FIG. 10 is an example block diagram of a computer device for implementing any of the operations as discussed herein according to embodiments herein.

As shown, computer system 1000 (such as implemented by any of one or more resources such as controller 140, management resource 141, etc.) of the present example includes an interconnect 1011 that couples computer readable storage media 1012 such as a non-transitory type of media (or hardware storage media) in which digital information can be stored and retrieved, a processor 1013 (e.g., computer processor hardware such as one or more processor devices), I/O interface 1014 (e.g., to output control signals to the power converter phases, monitor current, etc.), and a communications interface 1017.

I/O interface 1014 provides connectivity to any suitable circuitry such as power supply 100 and corresponding power converter phases 121, 122, 123, etc.

Computer readable storage medium 1012 can be any hardware storage resource or device such as memory, optical storage, hard drive, floppy disk, etc. In one embodiment, the computer readable storage medium 1012 stores instructions and/or data used by the management application 140-1 to perform any of the operations as described herein.

Further in this example embodiment, communications interface 1017 enables the computer system 1000 and processor 1013 to communicate over a resource such as network 190 to retrieve information from remote sources and communicate with other computers.

As shown, computer readable storage media 1012 is encoded with management application 140-1 (e.g., software, firmware, etc.) executed by processor 1013. Management application 140-1 can be configured to include instructions to implement any of the operations as discussed herein.

During operation of one embodiment, processor 1013 accesses computer readable storage media 1012 via the use of interconnect 1011 in order to launch, run, execute, interpret or otherwise perform the instructions in management application 140-1 stored on computer readable storage medium 1012.

Execution of the management application 140-1 produces processing functionality such as management process 140-2 in processor 1013. In other words, the management process 140-2 associated with processor 1013 represents one or more aspects of executing management application 140-1 within or upon the processor 1013 in the computer system 1000.

In accordance with different embodiments, note that computer system 1000 can be a micro-controller device, logic, hardware processor, hybrid analog/digital circuitry, etc., configured to control a power supply and perform any of the operations as described herein.

Functionality supported by the different resources will now be discussed via flowchart in FIG. 10. Note that the steps in the flowcharts below can be executed in any suitable order.

Figure 11:
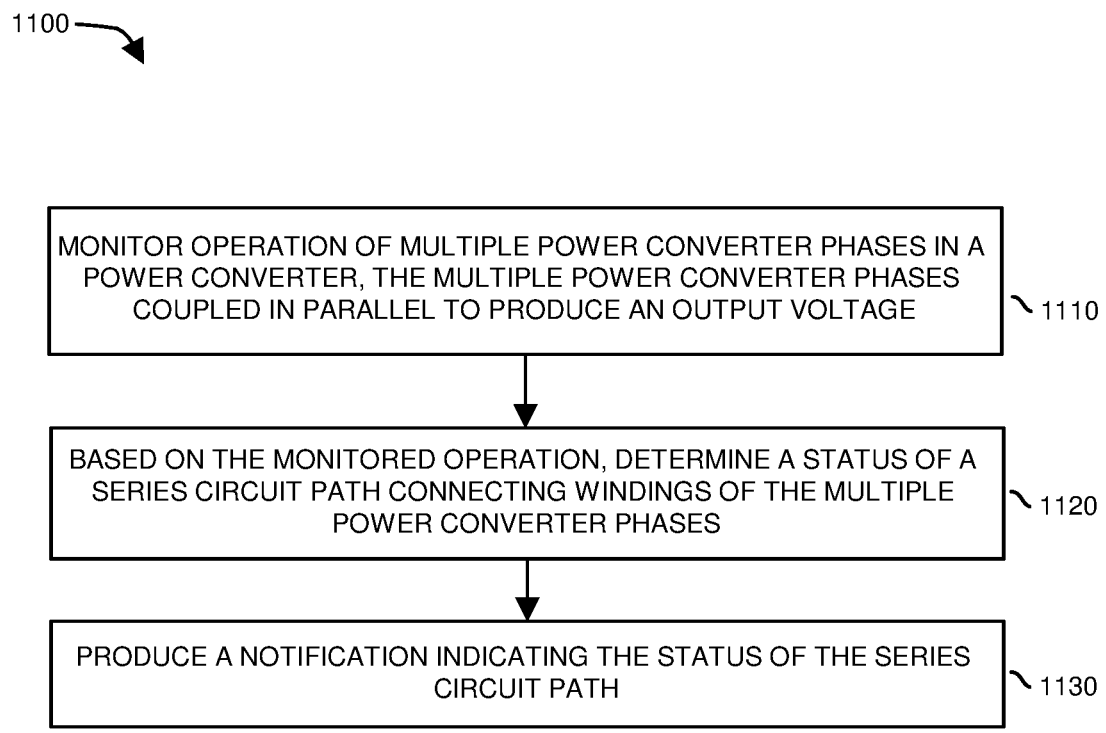
FIG. 11 is an example diagram illustrating a method according to embodiments herein.

FIG. 11 is an example diagram illustrating a method of controlling a power converter according to embodiments herein.

In processing operation 1110, in a test mode, the management resource 141 associated with the controller 140 monitors operation of multiple power converter phases 121 (such as power converter phase 121-1, power converter phase 121-2, . . . , power converter phase 121-N). As previously discussed, the multiple power converter phases 121 are coupled in parallel to produce an output voltage 123 to power a load 118.

In processing operation 1120, based on the monitored operation, the management resource 141 determines a status of the series circuit path 160 connecting windings of the multiple power converter phases 121.

In processing operation 1130, the management resource 141 produces status information 149 indicating the status of the series circuit path 160.

Figure 12:
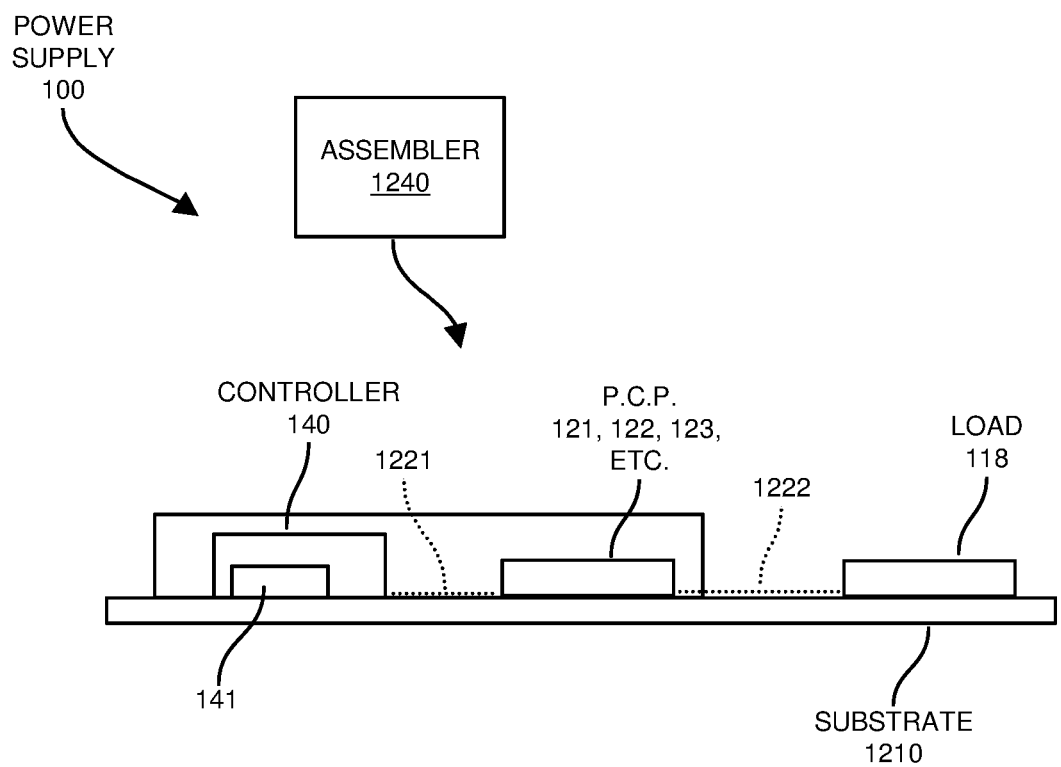
FIG. 12 is an example diagram illustrating assembly of a circuit according to embodiments herein.

FIG. 12 is an example diagram illustrating assembly of a power supply and multiple interconnected power converter phases on a circuit board according to embodiments herein.

In this example embodiment, assembler 1240 receives a substrate 1210 and corresponding components of power supply 100 to fabricate controller 140, power converter phases 121, 122, 123, etc. The assembler 1240 affixes (couples) the controller 140 and other components such as associated with the power converter phases, switches, etc., to the substrate 1210.

Via respective circuit paths 1221 as described herein, the assembler 1240 provides connectivity between the power converters, controller 140, etc. Note that components such as the controller 140, power converter 121, load 118, etc., can be affixed or coupled to the substrate 1210 in any suitable manner. For example, one or more of the components in power supply 100 can be soldered to the substrate 1210, inserted into sockets disposed on the substrate 1210, etc.

Note further that the substrate 1210 is optional. Any of one or more circuit paths or connectivity as shown in the drawings and as described herein can be disposed in cables or other suitable medium.

In one nonlimiting example embodiment, the load 118 is disposed on its own substrate independent of substrate 1210; the substrate of the load 118 is directly or indirectly connected to the substrate 1210 via wires, cables, links, etc. The controller 140 or any portion of the power supply 100 and corresponding power converter phases can be disposed on a standalone smaller board plugged into a socket of the substrate 1210 as well.

Via one or more circuit paths 1222 (such as one or more traces, cables, connectors, wires, conductors, electrically conductive paths, etc.), the assembler 1240 couples the power supply 100 and corresponding power converter phases to the load 118. In one embodiment, the circuit path 1222 conveys the output voltage 123 generated by the power converter phases to the load 118.

Accordingly, embodiments herein include a system comprising: a substrate 1210 (such as a circuit board, standalone board, mother board, standalone board destined to be coupled to a mother board, host, etc.); a power supply system 100 including corresponding components as described herein; and a load 118 (such as a motor, winding, etc.).

Note that the load 118 can be any suitable circuit or hardware such as one or more CPUs (Central Processing Units), GPUs (Graphics Processing Unit) and ASICs (Application Specific Integrated Circuits such those including one or more Artificial Intelligence Accelerators), which can be located on the substrate 1210 or disposed at a remote location.

Figure 13:
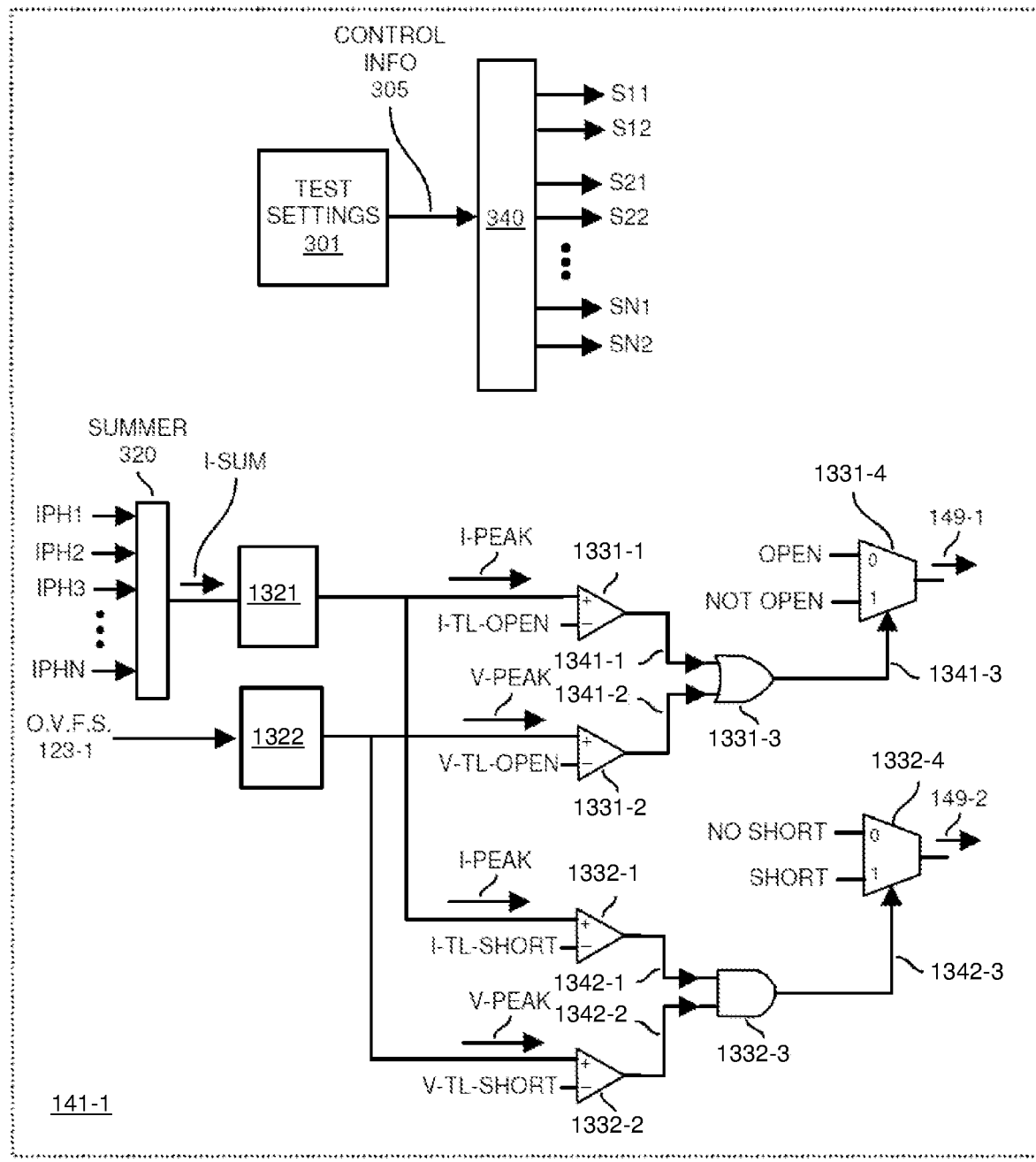
FIG. 13 is an example diagram illustrating a management resource operative to monitor a status of a series circuit path according to embodiments herein.

FIG. 13 is an example timing diagram illustrating a monitor resource operative to monitor a status of a series circuit path according to embodiments herein. Details of implementing the short and open tests are shown in FIGS. 8 and 9.

Referring again to FIG. 13, in this example embodiment, it is assumed or forced that the output voltage 123 starts at a reference voltage of 0.0 volts. For example, embodiments herein include, if desired, forcing the output voltage 123 to be an initial value of around (substantially) 0.0 volts at the start of the test (time=0) via application of a load or other suitable circuit to bleed off any charge (voltage) causing the output voltage to be above or below the zero voltage value.

Accordingly, there is no need to determine an initial reference voltage (VPREBIAS) as previously discussed in the circuit of FIG. 3.

Further in this example embodiment, given that the reference voltage is zero volts at the start of a respective test, the VPREBIAS circuitry (such as pre-bias voltage generator 323 and differential voltage generator 324) and differential voltage generator the threshold voltage values V-TL-OPEN and V-TL-SHORT are absolute voltage values (with respect to zero volt reference settings) and which are specified by test settings 301 or other suitable entity controlling the threshold voltage values.

More specifically, this instance of management resource 141 such as management resource 141-1 includes circuitry/logic such as summer 320, peak current detector 1321, peak voltage detector 1322, comparator 1331-1, comparator 1331-2, comparator 1332-1, comparator 1332-2, logic 1331-3, logic 1332-3, multiplexer 1331-4, and multiplexer 1332-4.

As shown in FIG. 13, in any suitable manner as previously discussed, the summer 320 receives values indicative of the magnitude of the respective output currents generated by the power converters. For example, the summer 320 receives: i) value IPH1 (magnitude of the current I_PHASE_1) supplied by the power converter 121-1 to produce the output voltage 123, ii) value IPH2 (magnitude of the current I_PHASE_2) supplied by power converter 121-2 to produce the output voltage 123, . . . , n) value IPHN (magnitude of the current I_PHASE_N) supplied by power converter 121-N to produce the output voltage 123. As its name suggests, the summer 320 produces I-SUM signal supplied to the peak current detector 321.

As further shown, the peak voltage detector 1322 receives the output voltage feedback signal 123-1 (such as output voltage 123 itself of a ratio-metric voltage value proportionally tracking the output voltage 123).

In further example embodiments, the controller 140 has access to test settings 301 in which to control operation of each of the power converters 121 during a test mode. For example, in one embodiment, for a given test, the controller 140 uses the control settings 301 to produce the different control signals S11/S12, S21/S22, . . . , SN1/SN2.

Note that the test settings 301 can be configured to include any number of control parameter settings in which to test a status of the series circuit path 160. For example, in one embodiment, the test settings 301 indicate, for a given test, a number of pulse width modulation pulses to be applied to one or more power converters, pulse widths of activating high side switch circuitry and low side switch circuitry, a switching frequency of controlling the power converters, an order of controlling different pulses applied to the power converters, etc.

Further in this example embodiment, the management resource 141 determines a respective open condition associated with the series circuit path 160 as shown in FIG. 4. In one embodiment, the open circuit condition as illustrated in FIG. 4 prevents a flow of the current 135 through the series circuit path 160.

Referring again to FIG. 13, to determine a respective open circuit condition associated with the series circuit path 160, the management resource 141 uses both the peak total current (I-PEAK) as produced by the peak current detector 1321 and the peak output voltage (V-PEAK) as produced by the peak voltage detector 1322.

More specifically, via comparator 1331-1, the management resource 141 compares a magnitude of the I-PEAK signal to a threshold value I-TL-OPEN. Based on the comparison, the comparator 1331-1 produces signal 1341-1 supplied to the input of logic 1331-3 (such as an OR gate).

Via comparator 1331-2, the management resource 141 compares a magnitude of the V-PEAK signal produced by the peak voltage detector 1322 to a threshold value V-TL-OPEN (such as threshold value V-TL-OPEN=0.200 VDC, see also FIG. 8). Based on the comparison, the comparator 1331-2 produces signal 1341-2 supplied to the input of logic 1331-3 (such as an OR gate).

As further shown, the logic 1331-3 generates signal 1341-3 based on the setting of the signal 1341-1 and signal 1341-2. If either of signal 1341-1 or signal 1341-2 is a logic high, the logic 1331-3 generates the signal 1341-3 to be a logic high. In such an instance, the multiplexer 1331-4 generates the status information 149-1 to be a logic high (or other suitable status value) such as indicating that the series circuit path 160 does not experience an open circuit condition. If neither of signal 1341-1 nor 1341-2 is a logic high, the logic 1331-3 generates the signal 1341-3 to be a logic low. In such an instance, the multiplexer 1331-4 generates the status information 149-1 to be a logic high (or other suitable status setting) such as indicating that the series circuit path 160 does experience an open circuit condition.

Further in this example embodiment, the management resource 141 determines a respective short circuit condition associated with each of the windings in the series circuit path 160 as shown in FIG. 5. In one embodiment, the short circuit condition prevents a respective power converter from operating properly. For example, in FIG. 5, the winding 221-1 of the power converter 121-1 is shorted, resulting in a failure associated with the power converter 121-1.

Referring again to FIG. 13, to determine a respective short circuit condition associated with the series circuit path 160, the management resource 141 uses both the peak total current (I-PEAK) as produced by the peak current detector 1321 and the peak output voltage (V-PEAK) as produced by the peak voltage detector 1322.

More specifically, via comparator 1332-1, the management resource 141 compares a magnitude of the I-PEAK signal produced by the peak current detector 1321 to a threshold value I-TL-SHORT. Based on the comparison, the comparator 1332-1 produces signal 1342-1 supplied to the input of logic 1332-3 (such as an AND gate).

Additionally, via comparator 1332-2, the management resource 141 compares a magnitude of the V-PEAK signal to a threshold value V-TL-SHORT (such as threshold value V-TL-SHORT=0.125 VDC, see also FIG. 9). Based on the comparison, the comparator 1332-2 produces signal 1342-2 supplied to the input of logic 1332-3 (such as an AND gate).

The logic 1332-3 generates signal 1342-3 based on the setting of the signal 1342-1 and signal 1342-2. If either of signal 1342-1 or 1342-2 is a logic low, the logic 1332-3 generates the signal 1342-3 to be a logic low. In such an instance, the multiplexer 1332-4 generates the status information 149-2 to be a logic low (or other suitable message value) such as indicating that the series circuit path 160 does not experience a short circuit condition in a respective winding being tested. If both signal 1342-1 and signal 1342-2 is a logic high, the logic 1332-3 generates the signal 1342-3 to be a logic high. In such an instance, the multiplexer 1332-4 generates the status information 149-2 to be a logic high such as indicating that a respective winding under test in the series circuit path 160 does experience a short circuit condition.

In one embodiment, if a short circuit condition is detected on a respective winding being tested, the management resource 141 generates the status information 149 to indicate a respective identity (such as winding 221-1 as in FIG. 4) of the winding that experiences the short circuit condition. When tested individually, in a manner as previously discussed, the management resource 141 determines when any respective winding of the secondary windings 221-1, 221-2, etc., experiences a respective short circuit failure.

Note again that techniques herein are well suited for use in circuit applications such as those that implement feedback monitoring. However, it should be noted that embodiments herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

The invention claimed is:

1. An apparatus comprising:
   management hardware operative to:
   monitor operation of multiple power converters in a power supply during a test mode, the multiple power converters coupled in parallel to produce an output voltage;
   based on the monitored operation, determine a status of a series circuit path connecting windings of the multiple power converters; and
   produce status information indicating the status of the series circuit path.

2. The apparatus as in claim 1, wherein the management hardware is further operative to:
   during the test mode, monitor a magnitude of the output voltage during application of test control signals to the multiple power converters to produce the output voltage.

3. The apparatus as in claim 2, wherein the management hardware is further operative to:
   during the test mode, monitor a respective magnitude of output current supplied by each of the multiple power converters to produce the output voltage.

4. The apparatus as in claim 1, wherein the status information indicates an open circuit condition associated with the series circuit path.

5. The apparatus as in claim 1, wherein the status information indicates a short circuit condition associated with a winding in the series circuit path.

6. The apparatus as in claim 5, wherein the status information includes an identity of the winding in the series circuit path experiencing the short circuit condition.

7. The apparatus as in claim 1, wherein the management hardware is further operative to, during the test mode:
   receive an output current value, the output current value indicative of a summation of output current supplied by each of the power converters; and
   produce the status information based on a comparison of the output current value to an output current threshold value.

8. The apparatus as in claim 1, wherein the management hardware is further operative to:
   receive an output voltage value, the output voltage value indicative of a magnitude of the output voltage;
   derive a reference voltage from the output voltage value at a beginning of the test mode;
   determine a peak magnitude of the output voltage value during the test mode;
   generate a differential voltage value based on a difference between the peak magnitude of the output voltage value and the reference voltage; and
   produce the status information based on a comparison of the differential voltage value to a voltage threshold value.

9. The apparatus as in claim 1, wherein the management hardware is further operative to:
   determine the status of the series circuit path based on: i) receipt of an output current value, the output current value indicative of a summation of output current supplied by each of the power converters, ii) receipt of an output voltage value, the output voltage value indicative of a magnitude of the output voltage, iii) comparison of the output current value to an output current threshold value, iv) derivation of a reference voltage from the output voltage value at a beginning of the test mode, v) determination of a peak magnitude of the output voltage value during the test mode, vi)

generation of a differential voltage value based on a difference between the peak magnitude of the output voltage value and the reference voltage, and vii) a comparison of the differential voltage value to a voltage threshold value.

10. The apparatus as in claim 1, wherein each of the multiple power converters includes a respective transformer including a corresponding primary winding and a corresponding secondary winding;
wherein the series circuit path includes a series connectivity of the corresponding secondary windings of the multiple power converters, the status information indicating a status of the series connectivity.

11. The apparatus as in claim 1, wherein the management hardware is further operative to:
select a test in which to control the operation of the multiple power converters; and
in furtherance of executing the test mode, communicate test mode settings associated with the selected test to a controller that applies control signals to the multiple power converters in accordance with the selected test to produce the output voltage.

12. A system comprising:
a circuit substrate;
the apparatus of claim 1, the apparatus coupled to the circuit substrate; and
wherein the output voltage powers a load.

13. A method comprising:
receiving a circuit substrate; and
coupling the apparatus of claim 1 to the circuit substrate.

14. The apparatus as in claim 1, wherein the multiple power converters include a first power converter and a second power converter;
wherein the first power converter includes a secondary winding disposed in the series circuit path;
wherein the second power converter includes a secondary winding disposed in the series circuit path; and
wherein the status indicates a state of connectivity of the secondary winding of the first power converter with respect to the secondary winding of the second power converter.

15. The apparatus as in claim 14, wherein the first power converter includes a primary winding magnetically coupled to the secondary winding of the first power converter;
wherein the second power converter includes a primary winding magnetically coupled to the secondary winding of the second power converter.

16. The apparatus as in claim 15, wherein the management hardware is operative to determine the state of connectivity based on a magnitude of first current through the primary winding of the first power converter and a magnitude of second current through the primary winding of the second power converter.

17. The apparatus as in claim 15, wherein a circuit node coupling the primary winding of the first power converter and the primary winding of the second power converter outputs the output voltage.

18. The apparatus as in claim 1, wherein the management hardware is operative to determine the status based on a magnitude of first current through a primary winding of a first power converter of the multiple power converters and a magnitude of second current through a primary winding of a second power converter of the multiple power converters.

19. The apparatus as in claim 1, wherein the multiple power converters include a first DC to DC power converter disposed in parallel with a second DC to DC power converter; and wherein an output node of the first DC to DC power converter outputs the output voltage and an output node of the second DC to DC power converter outputs the output voltage.

20. The apparatus as in claim 19, wherein the output node of the first DC to DC power converter is directly connected to the output node of the second DC to DC power converter.

21. The apparatus as in claim 1, wherein the multiple power converters are implemented as a trans-inductance voltage regulator operative to collectively convert an input voltage into the output voltage.

22. The apparatus as in claim 1, wherein the multiple power converters include a first power converter disposed in parallel with a second power converter;
wherein a first winding of the first power converter is operative to output first current to produce the output voltage;
wherein a first winding of the second power converter is operative to output second current to produce the output voltage; and
wherein the series circuit path includes a second winding of the first power converter disposed in series with a second winding of the second power converter.

23. The apparatus as in claim 22, wherein the second winding of the first power converter is magnetically coupled to the first winding of the first power converter; and
wherein the second winding of the second power converter is magnetically coupled to the first winding of the second power converter.

24. The apparatus as in claim 1, wherein the multiple power converters include a first power converter and a second power converter; and
wherein the windings are secondary windings of the multiple power converters, the secondary windings disposed in the series circuit path, the windings including a first secondary winding and a second secondary winding, the first power converter including the first secondary winding, the second power converter including the second secondary winding.

25. The apparatus as in claim 24, wherein the first secondary winding is disposed in a first transformer of the first power converter; and
wherein the second secondary winding is disposed in a second transformer of the second power converter.

26. The apparatus as in claim 1, wherein the management hardware is further operative to:
determine a magnitude of the output voltage during the test mode; and
produce the status information based on the magnitude of the output voltage.

27. The apparatus as in claim 26, wherein the management hardware is further operative to:
produce the status information to indicate a failure associated with the series circuit path based on the magnitude of the output voltage with respect to a voltage level.

28. A method comprising:
during a test mode:
monitoring operation of multiple power converters in a power supply, the multiple power converters coupled in parallel to produce an output voltage;
based on the monitoring, determining a status of a series circuit path connecting windings of the multiple power converters; and
producing status information indicating the status of the series circuit path.

29. The method as in claim 28, wherein the status information indicates a short circuit condition associated with a winding in the series circuit path; and wherein the status information indicates an identity of the winding in the series circuit path experiencing the short circuit condition.

30. The method as in claim 28, wherein monitoring operation of the multiple power converters includes:

during the test mode:

receiving an output current value, the output current value indicative of a summation of output current supplied by each of the multiple power converters; and wherein determining the status of the series circuit path connecting windings of the multiple power converters includes:

comparing the output current value to an output current threshold value.

31. The method as in claim 28, wherein monitoring operation of the multiple power converters includes: receiving an output voltage value, the output voltage value indicative of a magnitude of the output voltage; and wherein determining the status of the series circuit path includes: i) deriving a reference voltage value from the output voltage value at a beginning of the test mode, ii) determining a peak magnitude of the output voltage value during the test mode, iii) generating a differential voltage value based on a difference between the peak magnitude of the output voltage value and the reference voltage value, and iv) producing the status information based on a comparison of the differential voltage value and a voltage threshold value.

32. The method as in claim 28, wherein monitoring operation of the multiple power converters during the test mode includes:

i) receiving an output current value, the output current value indicative of a summation of output current supplied by each of the multiple power converters, and ii) receiving an output voltage value, the output voltage value indicative of a magnitude of the output voltage; and wherein determining the status of the series circuit path connecting windings of the multiple power converters includes: i) deriving a reference voltage value from the output voltage value at a beginning of the test mode, ii) determining a peak magnitude of the output voltage value during the test mode, iii) generating a differential voltage value based on a difference between the peak magnitude of the output voltage value and the reference voltage value, and iv) producing the status information based on a comparison of the differential voltage value and a voltage threshold value.

33. The method as in claim 28, wherein each of the multiple power converters includes a respective transformer including a corresponding primary winding and a corresponding secondary; and wherein the series circuit path includes a series connectivity of the corresponding secondary windings of the multiple power converters, the status information indicating a status of the series connectivity.

34. The method as in claim 28 further comprising:

selecting a test in which to control the operation of the multiple power converters; and in furtherance of executing the test mode, communicating test mode settings associated with the selected test to a controller that applies control signals to the multiple power converters in accordance with the selected test to produce the output voltage.

35. Computer-readable storage hardware having instructions stored thereon, the instructions, when executed by computer processor hardware, cause the computer processor hardware to:

control operation of multiple power converters of a power supply, the multiple power converters coupled in parallel to convert an input voltage into an output voltage;

determine a status of a series circuit path connecting windings of the multiple power converters; and produce status information indicating the status of the series circuit path.

* * * * *